(12) United States Patent
Stacey et al.

(10) Patent No.: US 10,523,018 B2
(45) Date of Patent: Dec. 31, 2019

(54) MODULAR ENERGY STORAGE SYSTEMS AND RELATED METHODS

(71) Applicant: Constance Susan Stacey, St. Albert (CA)

(72) Inventors: Constance Susan Stacey, St. Albert (CA); Bradley Ryan Madu, Langley (CA)

(73) Assignee: Constance Stacey, St. Albert (CA)

( * ) Notice: Subject to any disclaimer, the term of this patent is extended or adjusted under 35 U.S.C. 154(b) by 30 days.

(21) Appl. No.: 15/438,743

(22) Filed: Feb. 21, 2017

(65) Prior Publication Data

US 2018/0006470 A1 Jan. 4, 2018

Related U.S. Application Data

(60) Provisional application No. 62/357,930, filed on Jul. 1, 2016.

(51) Int. Cl.
*H02J 7/00* (2006.01)
*H02M 7/537* (2006.01)
(Continued)

(52) U.S. Cl.
CPC ............ *H02J 7/0013* (2013.01); *F21L 4/085* (2013.01); *H01M 2/1077* (2013.01);
(Continued)

(58) Field of Classification Search
CPC ....... F21L 4/085; F21L 4/08; H01M 10/4257; H01M 10/465; H01M 2010/4271;
(Continued)

(56) References Cited

U.S. PATENT DOCUMENTS 5,222,670 A * 6/1993 Huang .................. H01R 27/00
396/198
8,324,857 B1 12/2012 Chang et al.
(Continued)

FOREIGN PATENT DOCUMENTS

CA 3027976 12/2017
CN 101895155 11/2010
(Continued)

OTHER PUBLICATIONS

Battery Charge/Discharge Unit, NADA Scientific Ltd., URL=http://nadascientific.com/, published at least as early as Aug. 8, 2016, 2 pages.
(Continued)

*Primary Examiner* — Vuthe Siek
(74) *Attorney, Agent, or Firm* — Robert A. Nissen

(57) ABSTRACT

A modular energy storage system has: a battery module with a battery and internal circuitry; a control module with a power outlet, internal charge-and-discharge electrical components, and a power inlet for connection to a power source in use; the battery module defining a top seat that has an associated electrical connector; and the battery module being mounted to the control module below the control module by the top seat, whose respective associated electrical connector connects to the internal charge-and-discharge electrical components to permit the control module to: charge the battery module with power from the power source; and discharge the battery module by transferring power from the battery module to the power outlet.

20 Claims, 21 Drawing Sheets

(51) Int. Cl.
*H01M 10/46* (2006.01)
*F21L 4/08* (2006.01)
*H05K 7/20* (2006.01)
*H01M 2/10* (2006.01)
*H01M 10/42* (2006.01)

(52) U.S. Cl.
CPC ..... *H01M 10/4257* (2013.01); *H01M 10/465* (2013.01); *H02J 7/0042* (2013.01); *H02J 7/0065* (2013.01); *H02J 7/0068* (2013.01); *H02M 7/537* (2013.01); *H05K 7/2039* (2013.01); *H01M 2010/4271* (2013.01); *H01M 2220/10* (2013.01)

(58) Field of Classification Search
CPC .......... H01M 2220/10; H01M 2/1077; H01M 10/02; H01M 10/42; H01M 10/44; H01M 10/46; H01M 10/04; H01M 2/10; H02J 7/0013; H02J 7/0042; H02J 7/0065; H02J 7/0068; H02J 7/00; H02J 19/04; H02J 9/04; H02J 15/00; H02M 7/537; H05K 7/2039; H05K 7/20
See application file for complete search history.

(56) References Cited

U.S. PATENT DOCUMENTS

| | | | |
|---|---|---|---|
| 9,082,897 B2 | 7/2015 | Liu et al. | |
| 2006/0119104 A1* | 6/2006 | Wall | H02J 7/32 290/2 |
| 2007/0133219 A1* | 6/2007 | Chaloult | B60Q 3/74 362/490 |
| 2013/0154569 A1* | 6/2013 | Endo | H02J 7/0014 320/128 |
| 2017/0207631 A1 | 7/2017 | Helling et al. | |

FOREIGN PATENT DOCUMENTS

| | | | |
|---|---|---|---|
| CN | 103236706 | 8/2015 | |
| CN | 107222029 | 9/2017 | |
| WO | 2009097916 | 8/2009 | |
| WO | WO 2009/097916 | * 10/2009 | ............... H05K 7/20 |
| WO | 2017215752 | 12/2017 | |
| WO | 2017216308 | 12/2017 | |

OTHER PUBLICATIONS

Solar PPS Portable Power Supply User Manual, published at least as early as Oct. 18, 2016, 17 pages.
International Search Report issued on related application PCT/CA2017/051490, 3 pages.
Written Opinion issued on related application PCT/CA2017/051490, 6 pages.
Portable Solar Generator—Power Oak Co. Ltd, take from wayback machine «https://web.archive.org/web/20160427141001/http://www.poweroak.solar/», dated Apr. 27, 2016, 2 pages.
The intelligent energy cube, take from wayback machine «http://www.power-blox.com/», dated May 25, 2015, 6 pages.

* cited by examiner

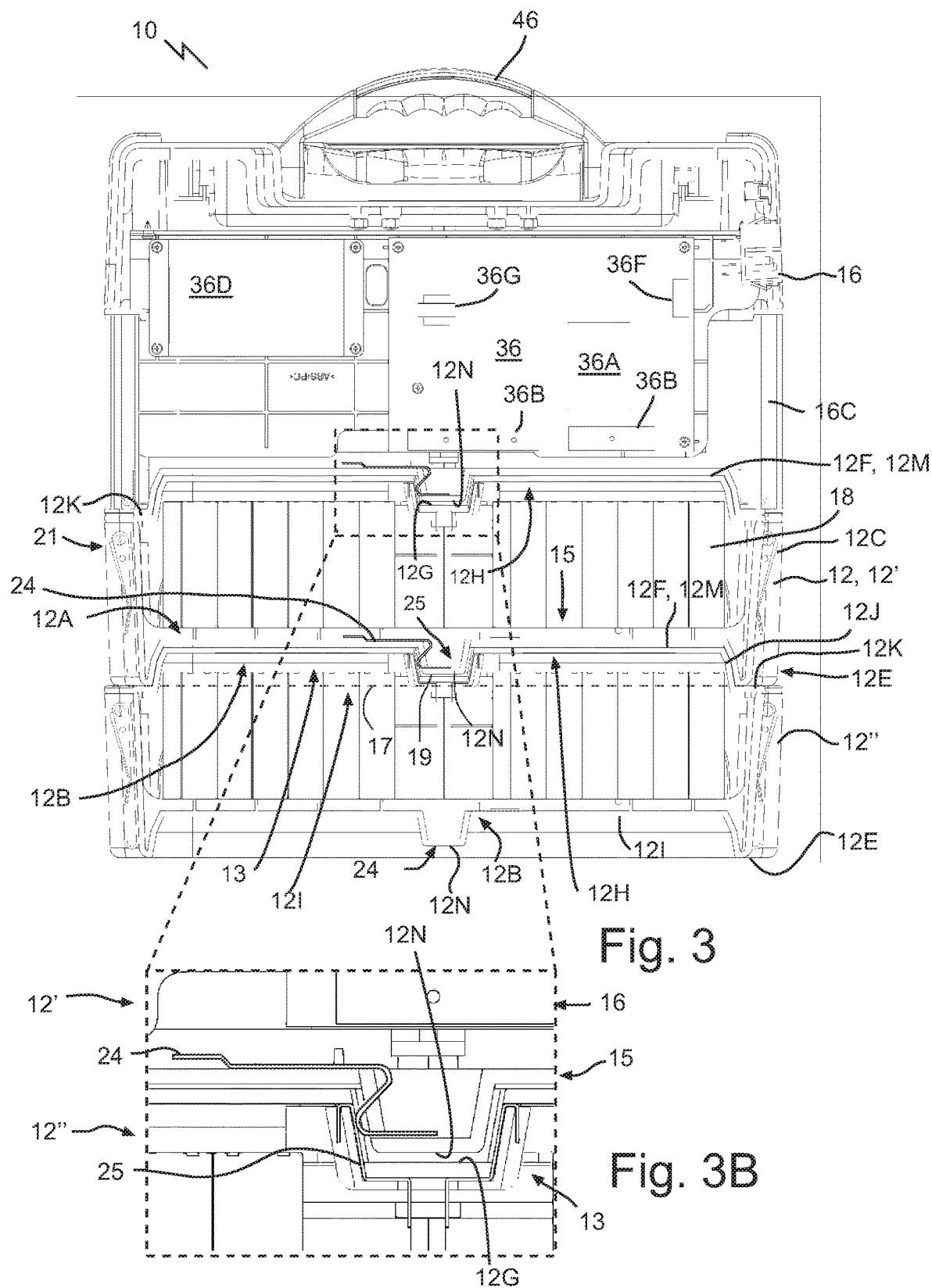

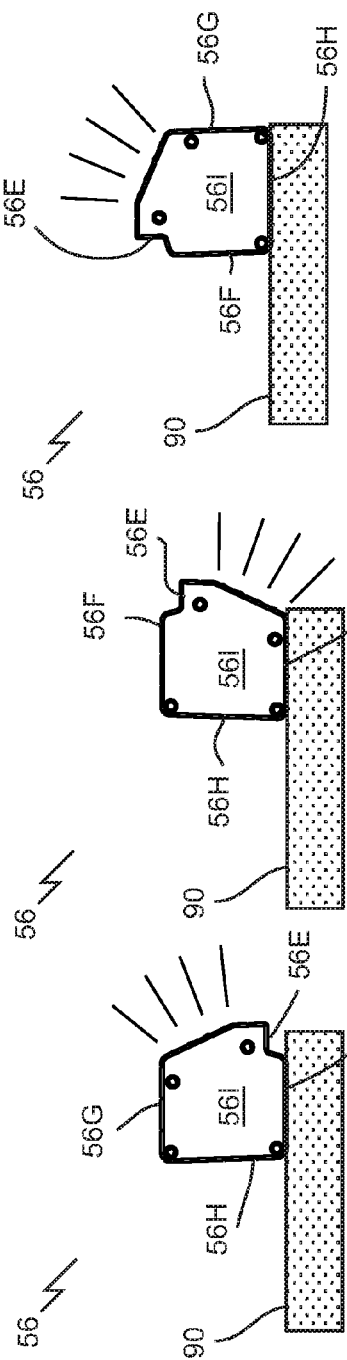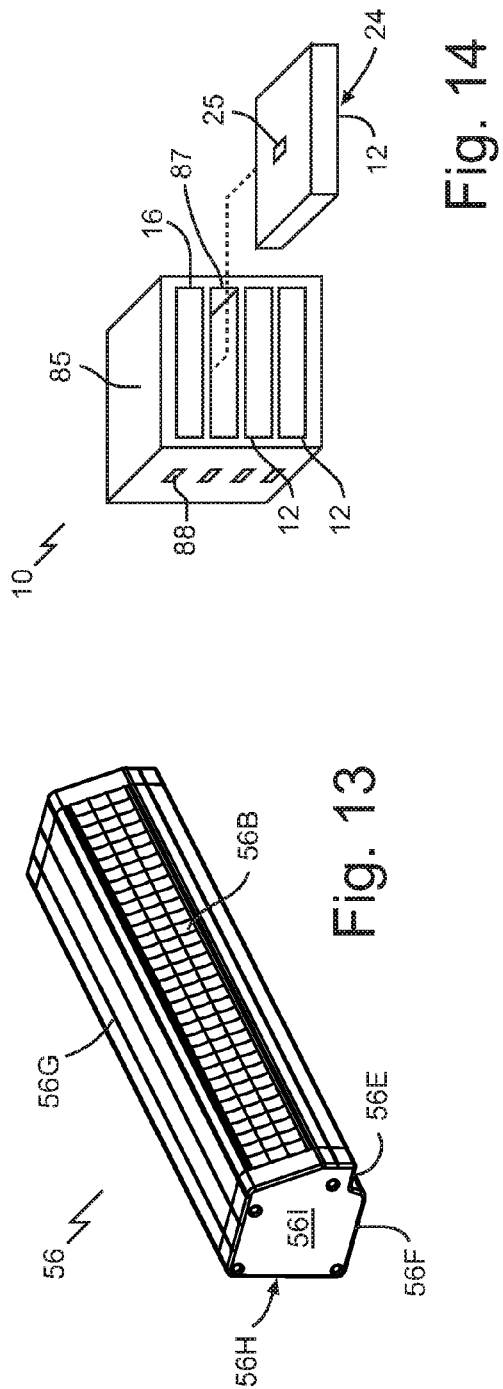

MODULAR ENERGY STORAGE SYSTEMS AND RELATED METHODS

CROSS-REFERENCE TO RELATED APPLICATIONS

This application claims the benefit under 35 USC 119(e) of U.S. provisional application Ser. No. 62/357,930 filed Jul. 1, 2016, the entirety of which is incorporated by reference.

TECHNICAL FIELD

This document relates to modular energy storage systems and related methods.

BACKGROUND

Fuel generators are used to provide A/C power to equipment at remote locations without access to the external power grid. Portable solar batteries and battery modules exist that comprise an array of batteries and a battery controller.

SUMMARY

A modular energy storage system is disclosed comprising: a battery module with a battery and internal circuitry; a control module with a power outlet, internal charge-and-discharge electrical components, and a power inlet for connection to a power source in use; the battery module defining a top seat that has an associated electrical connector; and the battery module being mounted to the control module below the control module by the top seat, whose respective associated electrical connector connects to the internal charge-and-discharge electrical components to permit the control module to: charge the battery module with power from the power source; and discharge the battery module by transferring power from the battery module to the power outlet.

A method is disclosed comprising assembling a modular energy storage system by connecting the battery module to the control module.

A modular energy storage system is also disclosed comprising: one or more battery modules; a power source; a control module containing internal electrical components that is connected to the power source; each of the one or more battery modules having a battery and internal circuitry, and defining both a bottom seat and a top seat, with the bottom and top seats each having an associated electrical connector; a first battery module of the one or more battery modules being mounted to the control module above or below the control module by a respective one of the bottom or top seats, whose respective associated electrical connector connects to the charge-and-discharge-circuitry; and in which the bottom and top seats, and associated electrical connectors, of each of the one or more battery modules, are formed to mate with the top and bottom seats, respectively, and associated electrical connectors, of adjacent battery modules stacked above or below, respectively, with the internal circuitry of each of the one or more battery modules adapted to transfer current between: the battery module and the control module; and the associated electrical connectors of the bottom and top seats.

A modular energy storage system is also disclosed comprising: a battery module with a battery and internal circuitry; a control module with a power outlet, internal charge-and-discharge electrical components, and a power inlet for connection to a power source in use; the battery module defining a bottom seat that has an associated electrical connector; the battery module being mounted to the control module above or below the control module by a respective one of the bottom seat or top seat, whose respective associated electrical connector connects to the internal charge-and-discharge electrical components to permit the control module to: charge the battery module with power from the power source; and discharge the battery module by transferring power from the battery module to the power outlet.

In one case a system is provided with stackable interchangeable battery modules. In one case the modules have a universal connector that can connect to the control module or another battery module.

The connectors between battery packs and between the housing and the battery pack may permit install of the battery pack in either direction—the batteries may be rotated 180 degrees, 90 degrees, or other increments, and the battery will still engage. The connectors on the control and bottom modules depend from the bottom but may be raised above the ground surface to limit contact with any water on the ground, such as in a boat or outdoor application, even if the ground is just a little moist.

The control module (housing) may contain the inverter module on top, LED lights, Bluetooth speaker, and other features. The sides may be corrugated/finned to avoid using a fan to cool the inverter. The sides may be made of heat transfer metal. The light may pull off like a flashlight, and may have a suitable connection to the control module. The control module may have AC/DC outlets, USB outlets, car outlets. The power output of the unit may be tailored depending on the number of battery modules.

The bottom modules may include batteries that can be individually charged, and can stack indefinitely. The top part may have a raised part that acts as a male connector for the larger depending female wall of the above battery or control module, and to act as a moisture seal. The raised part or wall may form a planar top surface, with a small indent or pool that contains electrical spring pin connectors in the center. In a 48V system, DC current, the device may have watt hours of 1200 watt hours per battery module. The batteries may connect via parallel or serial connections. Lithium ion cells may be used. Spring connectors may hook onto the top modules. Modules can be daisy chained together.

Suitable latches may be used to connect modules, such as over the center latches on either end of the modules for securing modules. The hook may be on the top part of the latches.

End users include anyone that may use a generator or a power source. For example, applications include RV, camping, acreages, industrial, residential, oil and gas, field operations, trade shows and others. Because the unit produces no fumes it may be run inside enclosed spaces, for example at trade shows and weddings.

The unit may be connected to a solar panel or other energy source such as a wall plug to power the batteries. The more batteries the longer the charging time for a given power supply.

The batteries may also slide in to an embodiment of the control module that is similar to a server rack that permits batteries to be charged and removed as needed. A battery may slide in laterally and have a lock that drops the connector into engagement or raises the battery into engagement.

In various embodiments, there may be included any one or more of the following features: The battery module defines a bottom seat with an associated electrical connector.

The bottom seat of the battery module is structured such that if a second battery module identical to the battery module were stacked below the battery module, the bottom seat and associated electrical connector of the battery module would mate with the top seat and associated electrical connector, respectively, of the second battery module, to permit the control module to charge and discharge the battery module and the second battery module. A second battery module, with a top seat and an associated electrical connector, in which the second battery module is mounted to the battery module below the battery module, with the bottom seat and associated electrical connector of the battery module mating with the top seat and associated electrical connector, respectively, of the second battery module, to permit the control module to charge and discharge the battery module and the second battery module. The control module is connected to independently charge and discharge the battery module and the second battery module. The control module is connected in parallel to the battery module and the second battery module through the associated electrical connectors of the battery module and the second battery module. The second battery module defines a bottom seat with an associated electrical connector. The bottom seat of the second battery module is structured such that if the battery module were stacked below the second battery module, the bottom seat and associated electrical connector of the second battery module would mate with the top seat and associated electrical connector, respectively, of the battery module, to permit the control module to charge and discharge the battery module and the second battery module. The battery module and the second battery module are identical. The battery module has a housing formed by a sidewall, a base defining a base face, and a roof defining a top face. The bottom seat is defined by the base face. The top seat is defined by the top face. The base face is indented to form a receptacle encircled and defined by a peripheral rim of the base, with the receptacle defining the bottom seat. The top face has a raised part encircled and defined by a peripheral ledge, with the raised part defining the top seat, and the raised part being shaped to fit within the receptacle of an adjacent battery module. The receptacle is shaped to form an inverse shape of the raised part. The raised part forms a raised platform. The associated electrical connector of the top seat is located within a female receptacle in the raised part. The associated electrical connector of the bottom seat forms a male part that depends from the receptacle of the base face. A base end of the male part sits above a plane defined by the bottom face. Each associated electrical connector is located in a central part of the respective base face or top face. The bottom seat and the top seat, and respective associated electrical connectors, are structured to permit the battery module to mount to a second battery module identical to the battery module about a plurality of angular orientations relative to one another defined about a stacking axis of the modular energy storage system. The bottom seat and the top seat, and respective associated electrical connectors, are structured such that the plurality of angular orientations include a pair of positions that are 180 degrees apart relative to one another about the stack axis. The bottom seat and the top seat, and the respective associated electrical connectors, are structured such that the respective associated electrical connects automatically mate if the bottom seat and the top seat, of the battery module and a second battery module, of identical construction as the battery module, were to mate together. Locking parts to one or more of: secure the battery module to the control module; and secure the battery module to a second battery module identical to the battery module, if the second battery module were stacked below the battery module. The locking parts comprise over the center latches. The internal charge-and-discharge electrical components comprise an inverter. The control module comprises a heat sink connected to the inverter. The heat sink: is formed by one or both finned or corrugated metal; and wraps circumferentially around, to define an external surface of, the control module. The inverter is a fanless inverter. The heat sink has an internal part that forms an internal structural frame of the inverter. The heat sink has an external part that forms an external surface of the control module. The internal part and the external part are formed of thermally conductive materials in thermal communication with one another. The internal part mounts metal oxide field effect transistors (MOSFET) of the inverter. The control module further comprises a removable flashlight, which has an internal battery and is reversibly mounted to the control module with the internal battery connected to the internal charge-and-discharge electrical components. The control module has a bottom seat and associated electrical connector that mate with the top seat and associated electrical connector, respectively, of the battery module. Assembling the modular energy storage system by connecting the battery module to the control module. Replacing the battery module with a further battery module. Connecting a second battery module to the battery module. The power source comprises a solar power collector. The control module has a battery status display panel. Each associated electrical connector comprises a plurality of associated electrical contacts. The associated electrical contact of the bottom seat, the top seat, or both, is spring biased to contact an adjacent associated electrical contact of an adjacent battery module. The respective batteries of the first battery module and the second battery module are connected to form an equalizing circuit with the internal electrical components. Sidewalls of adjacent modules are flush when mated.

These and other aspects of the device and method are set out in the claims, which are incorporated here by reference.

BRIEF DESCRIPTION OF THE FIGURES

Embodiments will now be described with reference to the figures, in which like reference characters denote like elements, by way of example, and in which:

FIG. 3 is a section view taken along the 3-3 section lines in FIG. 1A.

FIG. 3B is an enlarged detail end view of the modular energy storage system in FIG. 3 showing male and female electrical connectors.

FIGS. 12A-C are end views of an embodiment of a flashlight module in various orientations on a surface.

FIG. 13 is a perspective view of the flashlight in FIGS. 11A-C.

FIG. 14 is an exploded perspective view of a further embodiment of a stackable modular energy system with sliding modules.

DETAILED DESCRIPTION

Immaterial modifications may be made to the embodiments described here without departing from what is covered by the claims.

A generator is a device that converts mechanical energy to electrical energy that can then be used to power electrical equipment. Sources of mechanical energy include steam turbines, gas turbines, water turbines, internal combustion engines, hand cranks and others. One commonly used generator is an engine generator or genset. An engine generator is the combination of an electrical generator and an engine mounted together to form a single piece of equipment. Engine generators are available in a wide range of power ratings. Generators may run on gasoline, diesel, natural gas, propane, bio-diesel, water, sewage gas or hydrogen. Most smaller generator units are built to use gasoline as a fuel, and larger units have various fuel types, including diesel, natural gas and propane (liquid or gas). Gas generators may produce harmful emissions for the environment and must be used in a well-ventilated area, such as the outdoors.

Figure 1:
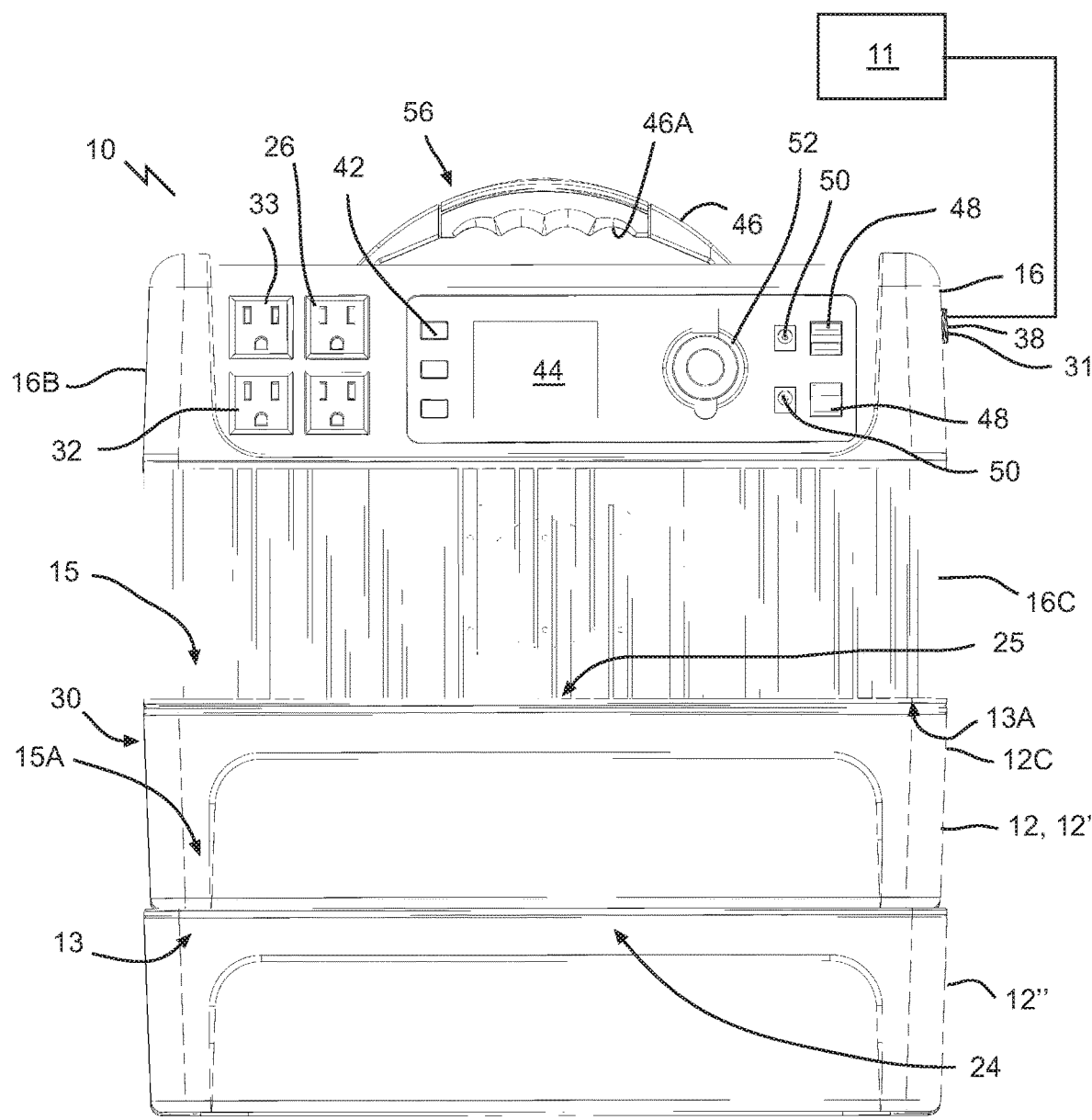
FIG. 1 is a front end view of an embodiment of a modular energy storage system.
Figure 1A:
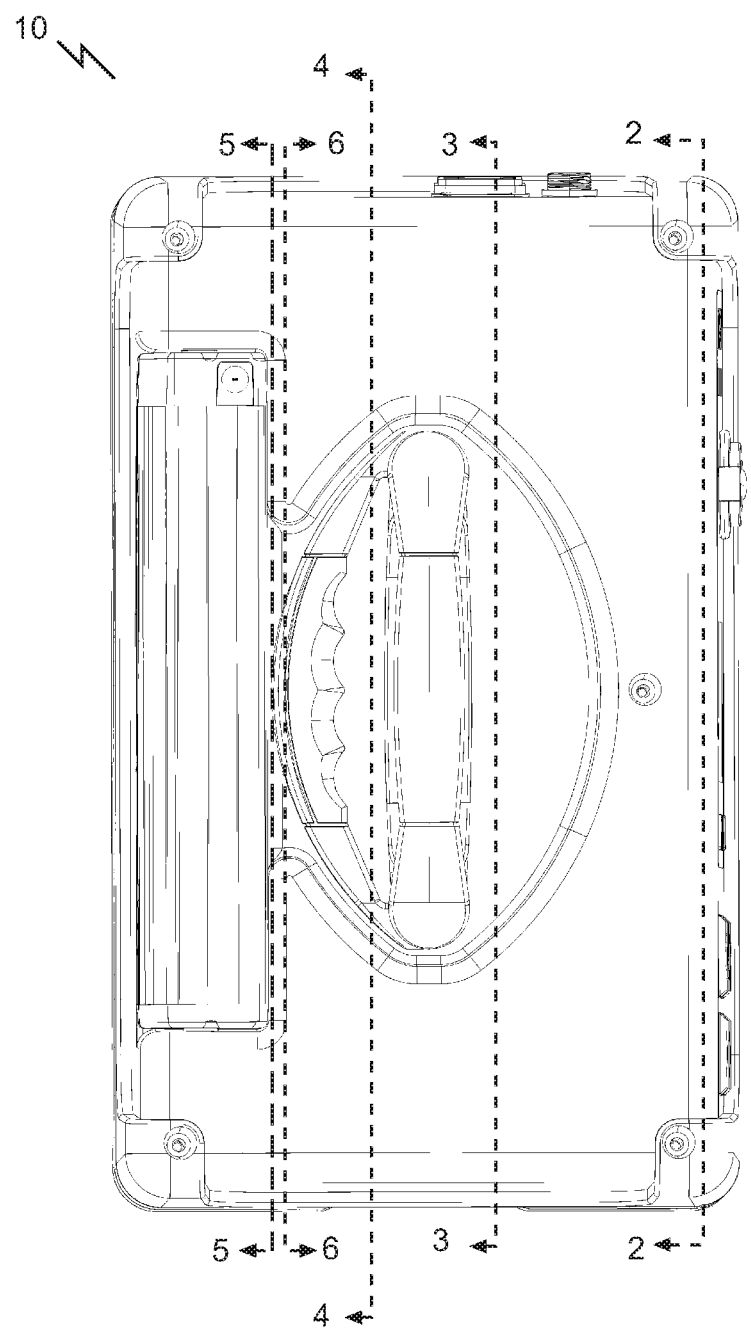
FIG. 1A is a top view of the modular energy storage system shown in FIG. 1.
Figure 8:
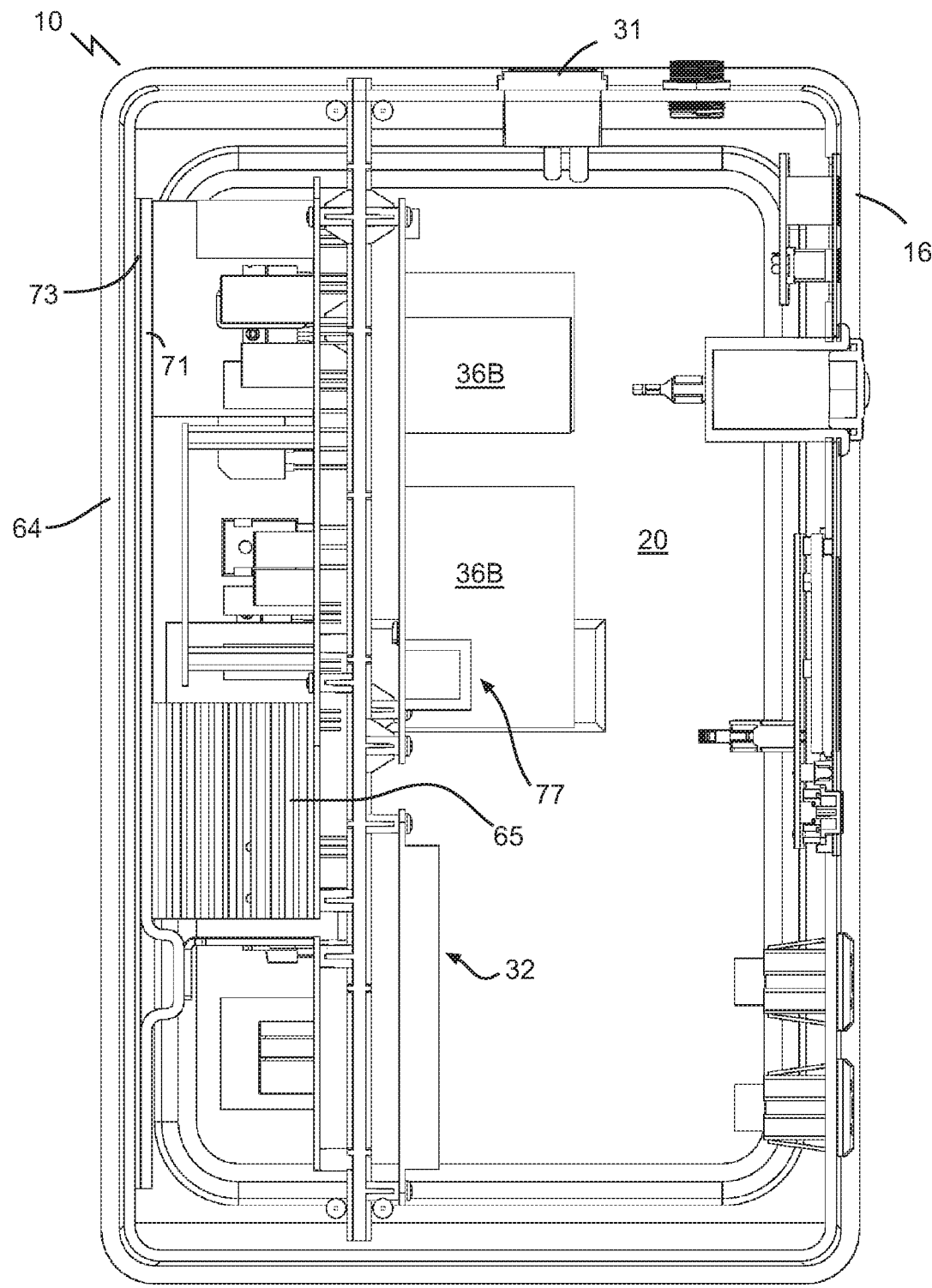
FIG. 8 is a section view taken along the 8-8 section lines in FIG. 7.
Figure 8A:
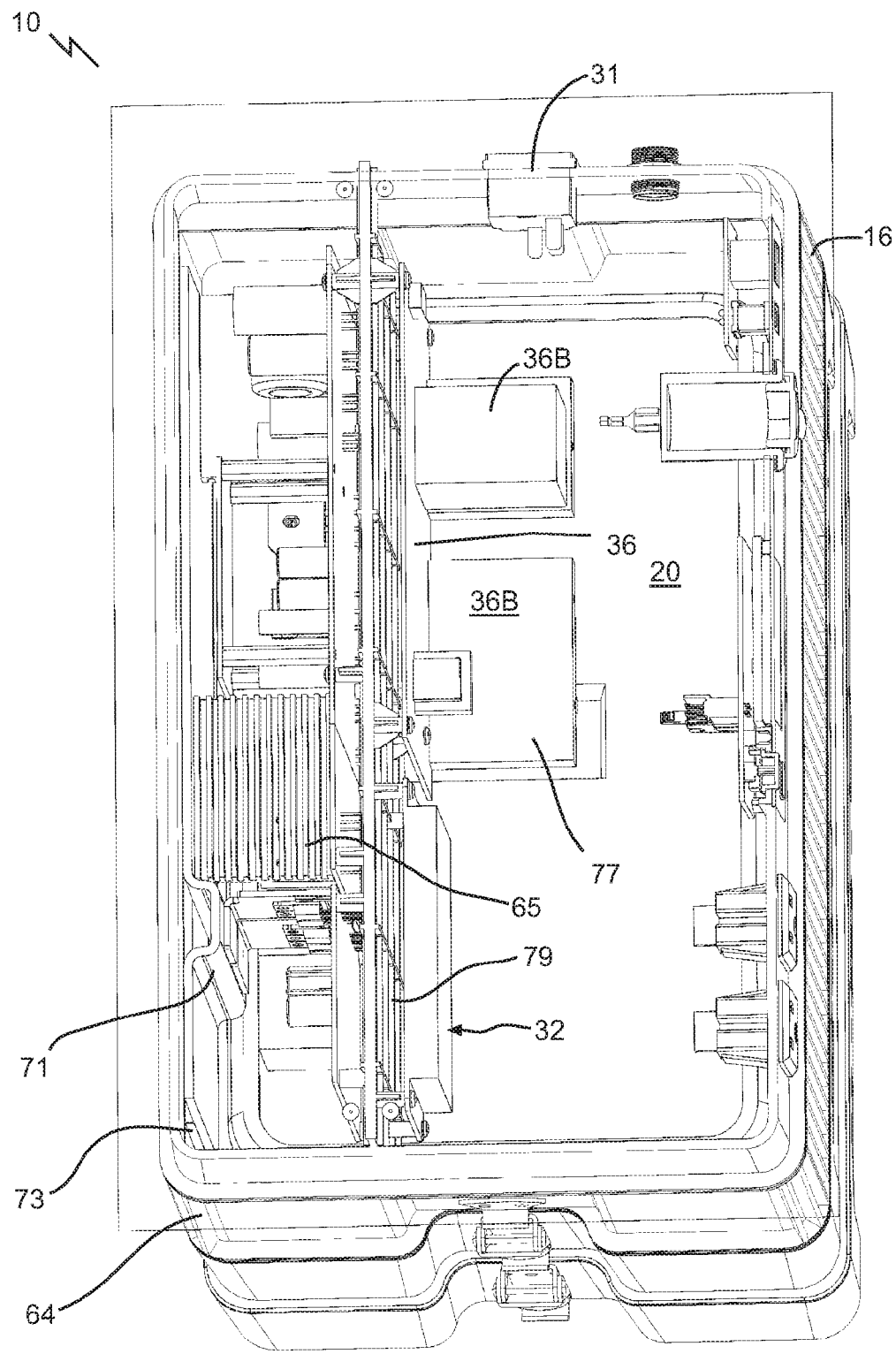
FIG. 8A is a perspective view of the portion of the modular energy storage system as shown in FIG. 8.
Figure 16:
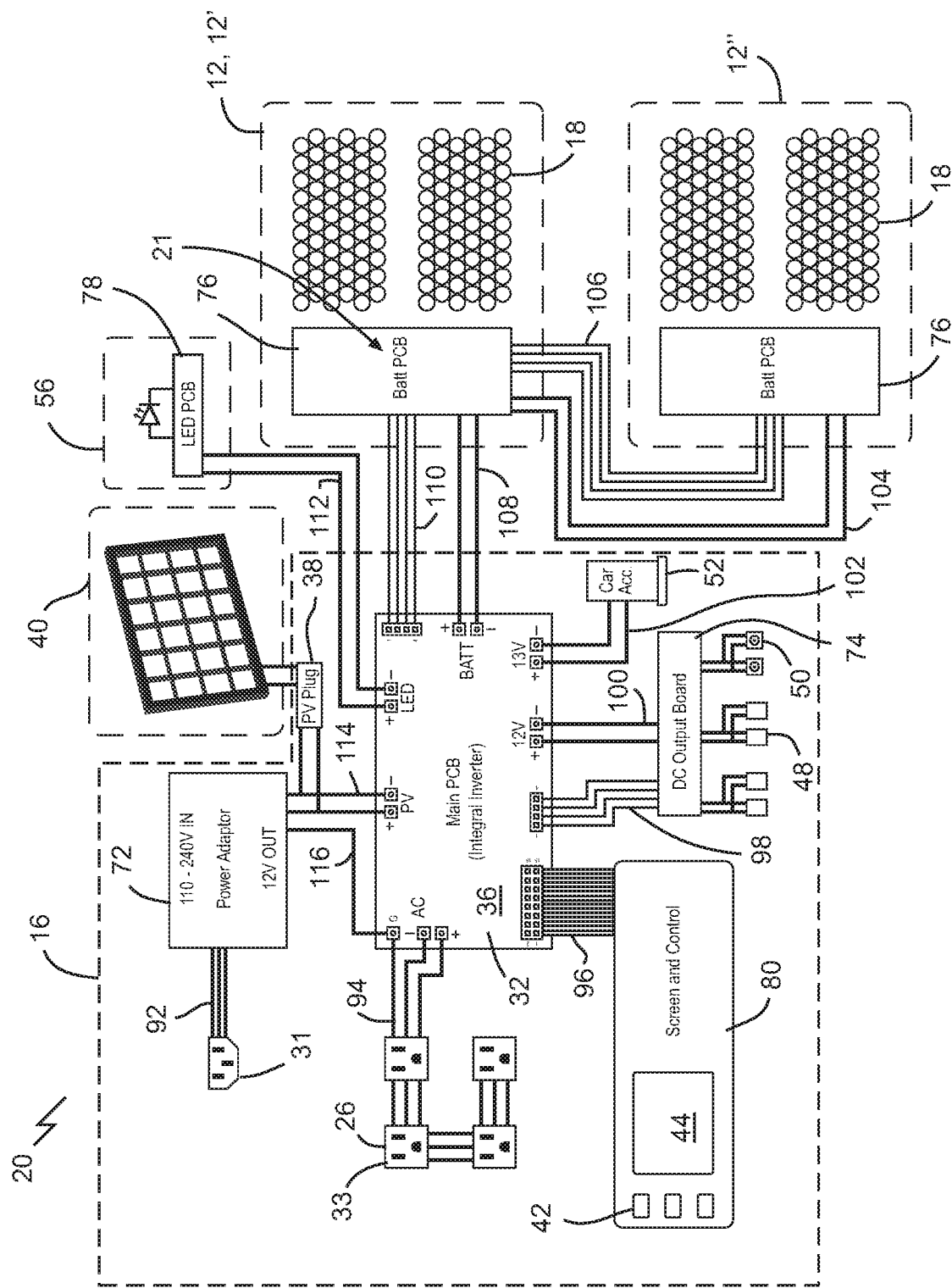
FIG. 16 is a circuit diagram for operating various parts of the apparatus of FIG. 1.

Referring to FIGS. 1, 8, and 8A, a modular energy storage system 10 is disclosed comprising one or more battery modules 12 and a control module 16. The control module 16 may have a power outlet 26, internal electrical components, such as internal charge-and-discharge electrical components 20, and a power inlet 31. Power inlet 31 may be connected to a suitable power source 11 in use, such as an alternating current (A/C) wall outlet or solar panel 40 (FIG. 16). Power source 11 may be disconnected at times, for example when system 10 is being transported or used at a remote location. Modular energy storage system 10 may store energy acquired from a suitable power source, such as solar power, in one or more battery modules 12, and discharge the energy via outlet or outlets 33.

Figure 3A:
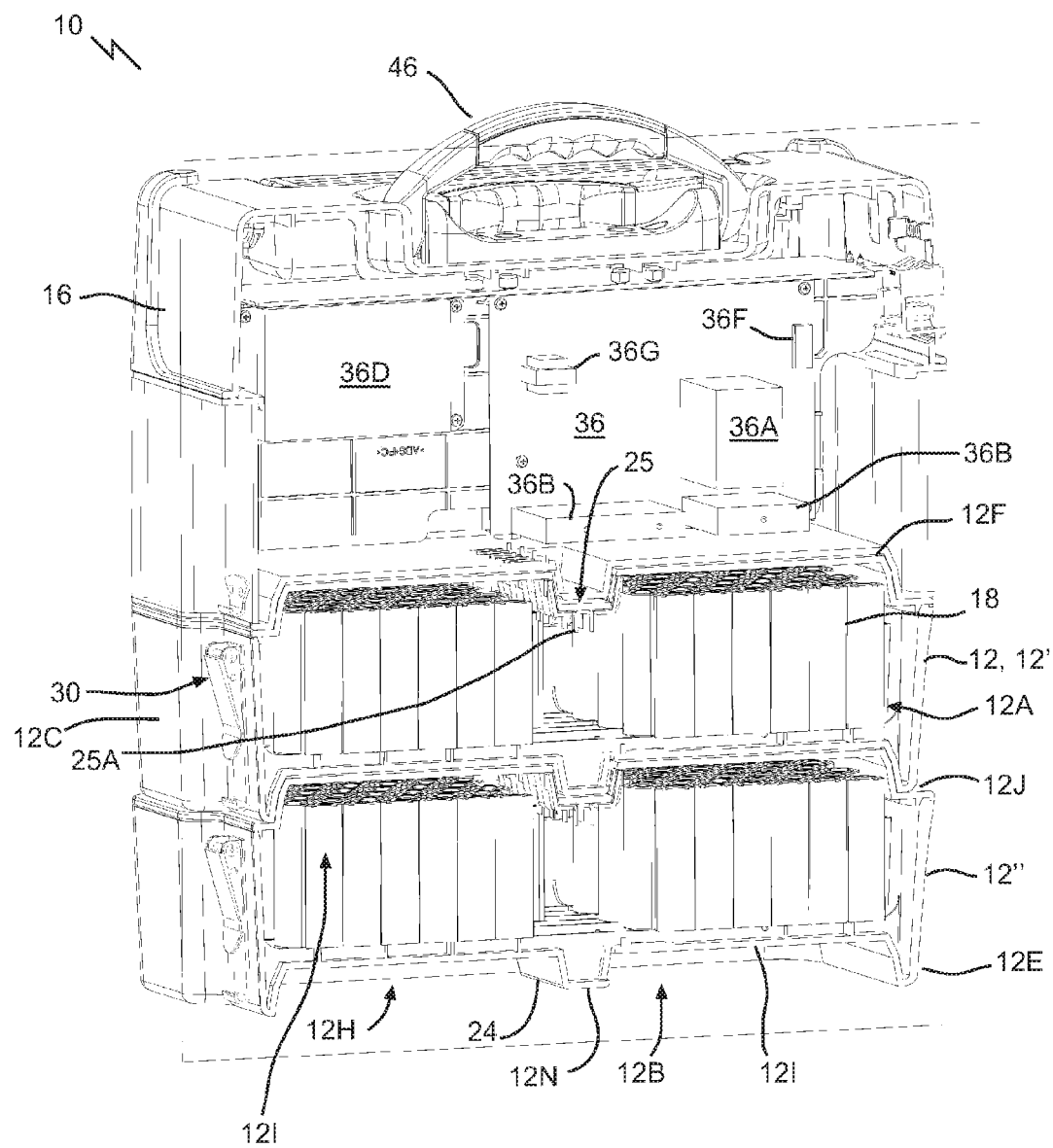
FIG. 3A is a perspective view of the portion of the modular energy storage system as shown in FIG. 3.
Figure 9:
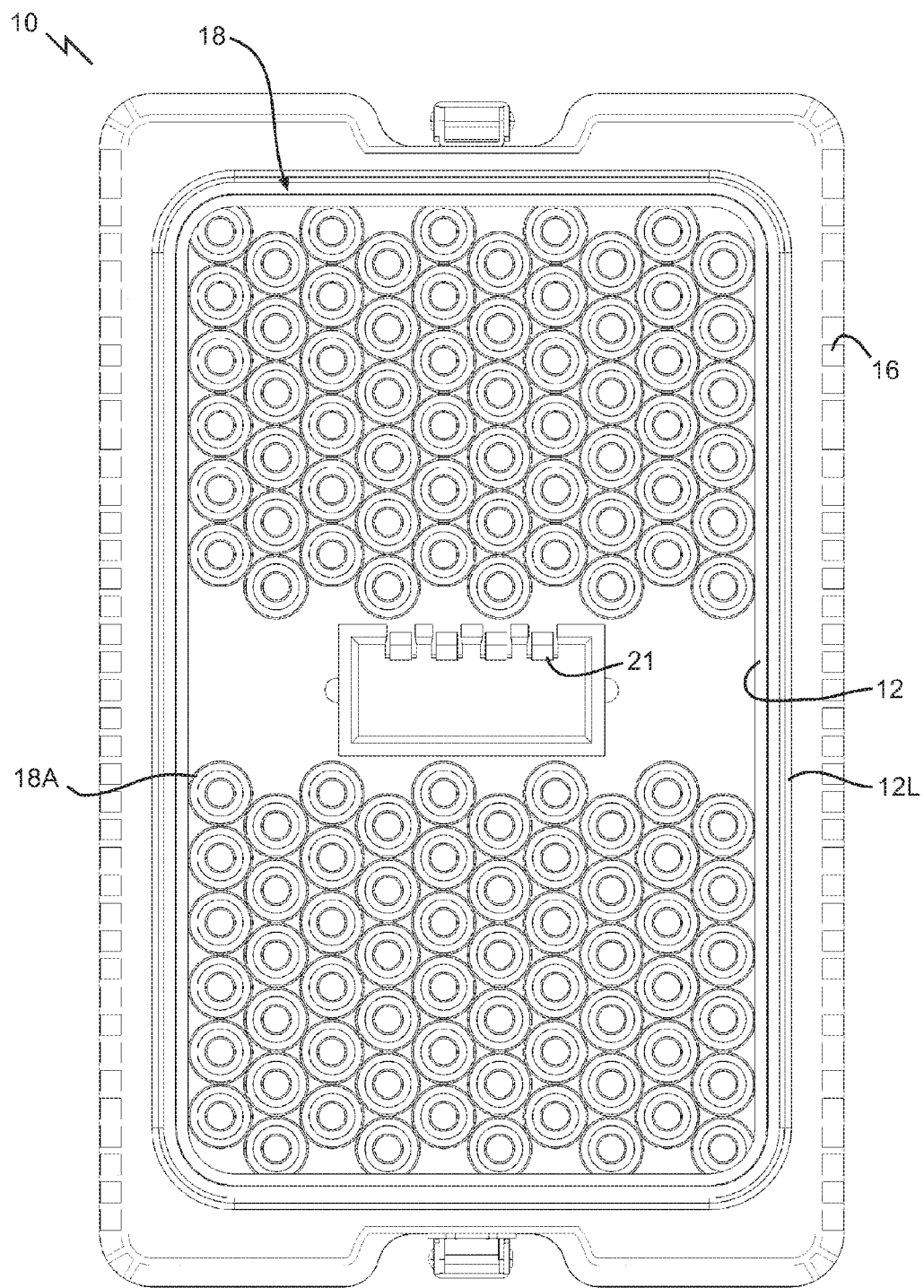
FIG. 9 is a section view taken along the 9-9 section lines in FIG. 7.
Figure 9A:
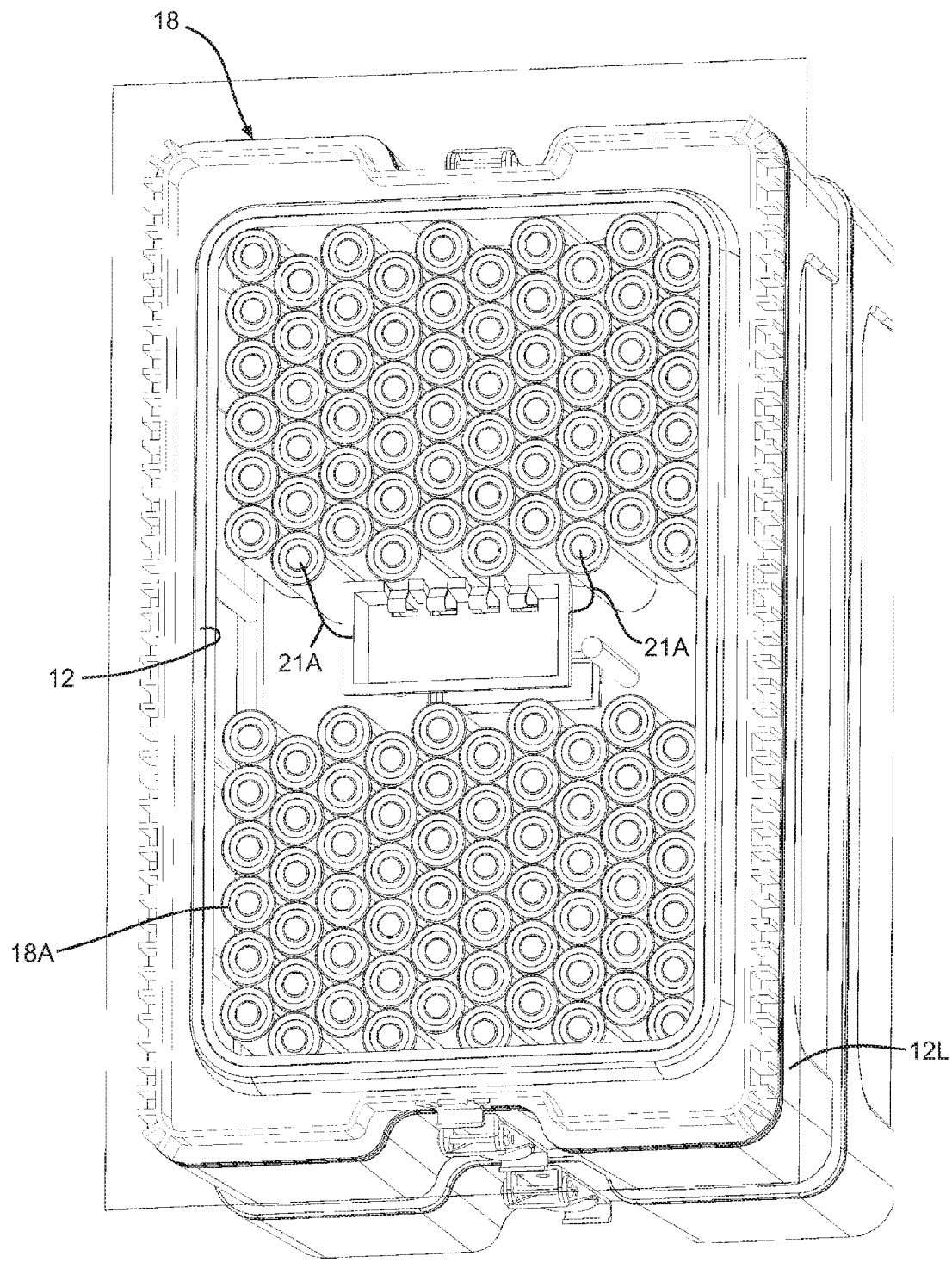
FIG. 9A is a perspective view of the portion of the modular energy storage system as shown in FIG. 9.
Figure 11A:
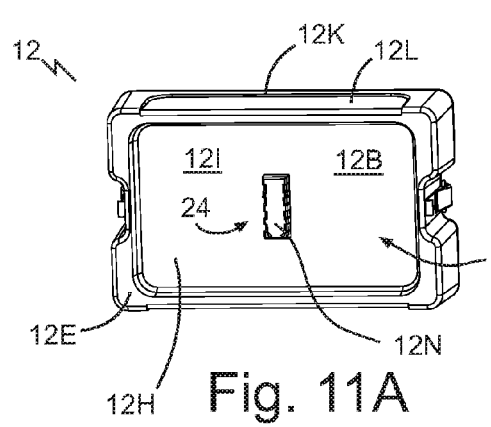
FIG. 11A is a bottom perspective view of a battery module of the modular energy storage system in FIG. 1, showing a male electrical connector.

Referring to FIGS. 9 and 9A, each of the one or more battery modules 12 may comprise a battery 18 and internal circuitry 21. Referring to FIGS. 11 and 11A, the battery module 12 may define one or both a bottom seat 13 and a top seat 15. Each of bottom and top seats 13, 15 may comprise an associated electrical connector 24 and 25, respectively. Referring to FIGS. 1, 3, and 3A, battery module 12 may be mounted to the control module 16 above or below the control module 16, in this case below, and may be mounted by a respective one of the bottom seat 13 or top seat 15, in this case top seat 15. The respective associated electrical connector 24, 25 may connect to the internal charge-and-discharge electrical components 20 when mounted. Components 20 may permit the control module 16 to charge the battery module 12 with power from power source 11 (FIG. 1). Components 20 may permit control module 16 to discharge battery module 12 by transferring power from battery module 12 to the power outlet 33.

Referring to FIGS. 10, 11A, 11B, and 15, the bottom and top seats 13 and 15 of the battery module 12, such as first battery module 12', may be structured such that if a second battery module 12" identical to the battery module 12' were stacked above or below the battery module, the respective adjacent seats and associated electrical connectors of the modules 12' and 12" would mate. Identical may refer to the fact that the seats 13 and 15 of battery module 12" are identical with or complimentary with the seats 13 and 15 of the battery module 12'. In some cases identical means that all of the components and features of battery module 12" are the same as the same components for battery module 12'. In the example shown the bottom seat 13 and associated electrical connector 24 of the battery module 12' mates with the top seat 15 and associated electrical connector 25, respectively, of the second battery module 12". Once mated, the control module 16 is able to charge and discharge the battery module 12' and the second battery module 12". In such a fashion, battery modules 12', 12", and more if desired, may be stacked one on the other, with the internal circuitry 21 (FIG. 9) of each of the one or more battery modules 12 being adapted to transfer current between the respective battery module and the control module 16 and the associated electrical connectors 24, 25 of the bottom and top seats 13, 15.

Figure 10:
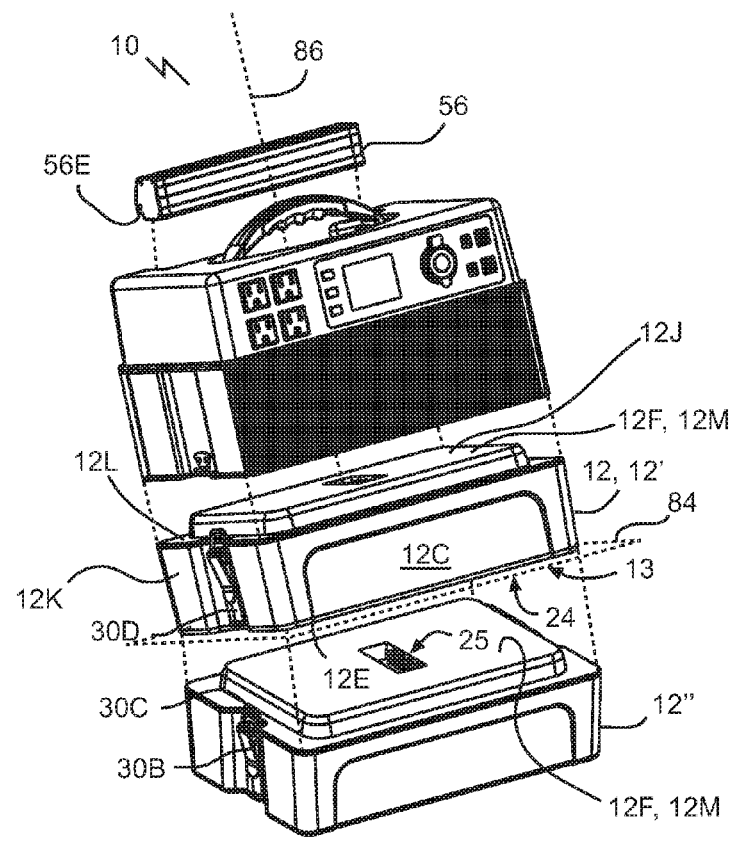
FIG. 10 is an exploded perspective view of the modular energy storage system of FIG. 1.
Figure 11B:
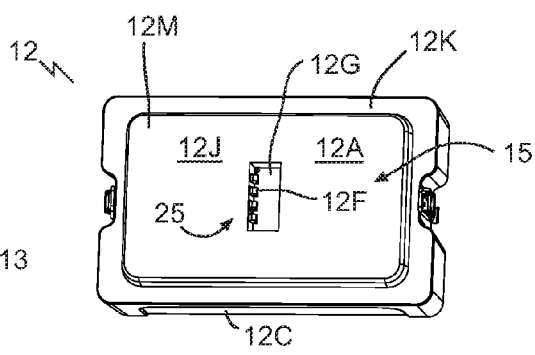
FIG. 11B is a top perspective view of the battery module of FIG. 10A showing a female electrical connector.

Referring to FIGS. 3, 3A, 3B, 9, and 9A, each battery module 12 may have a suitable external structure. Referring to FIGS. 10, 11A, and 11B, battery module 12 may comprise housing 12K that houses the inner components of module 12. Housing 12K may be formed by a sidewall or a plurality of sidewalls 12C, a base 12I and a roof 12J. Housing 12K of battery module 12 may be shaped to stack on another module 12, for example battery module 12' stacked on second battery module 12". Referring to FIG. 11A, the base 12I may define a base face 12B. The base face 12B may define the bottom seat 13. Referring to FIG. 11B, the roof 12J may define a top face 12A. The top face 12A may define the top seat 15. Referring to FIG. 3, base face 12B of battery module 12 may be shaped to mate with the top face 12A of another battery module 12, such as battery module 12", and vice versa. Housing 12K may be shaped to permit connection of the internal circuitry 21 of adjacent modules 12 upon mating of respective seats. Referring to FIG. 3, battery modules 12 may interlock together and mount one on the other when stacked. Stacking plural battery modules 12 may provide an expandable and flexible source of power supply and storage for control module 16, as a user that desires additional power may choose to add modules 12, while a user whose power needs are relatively lower may choose to reduce the number of modules 12.

Figure 15:
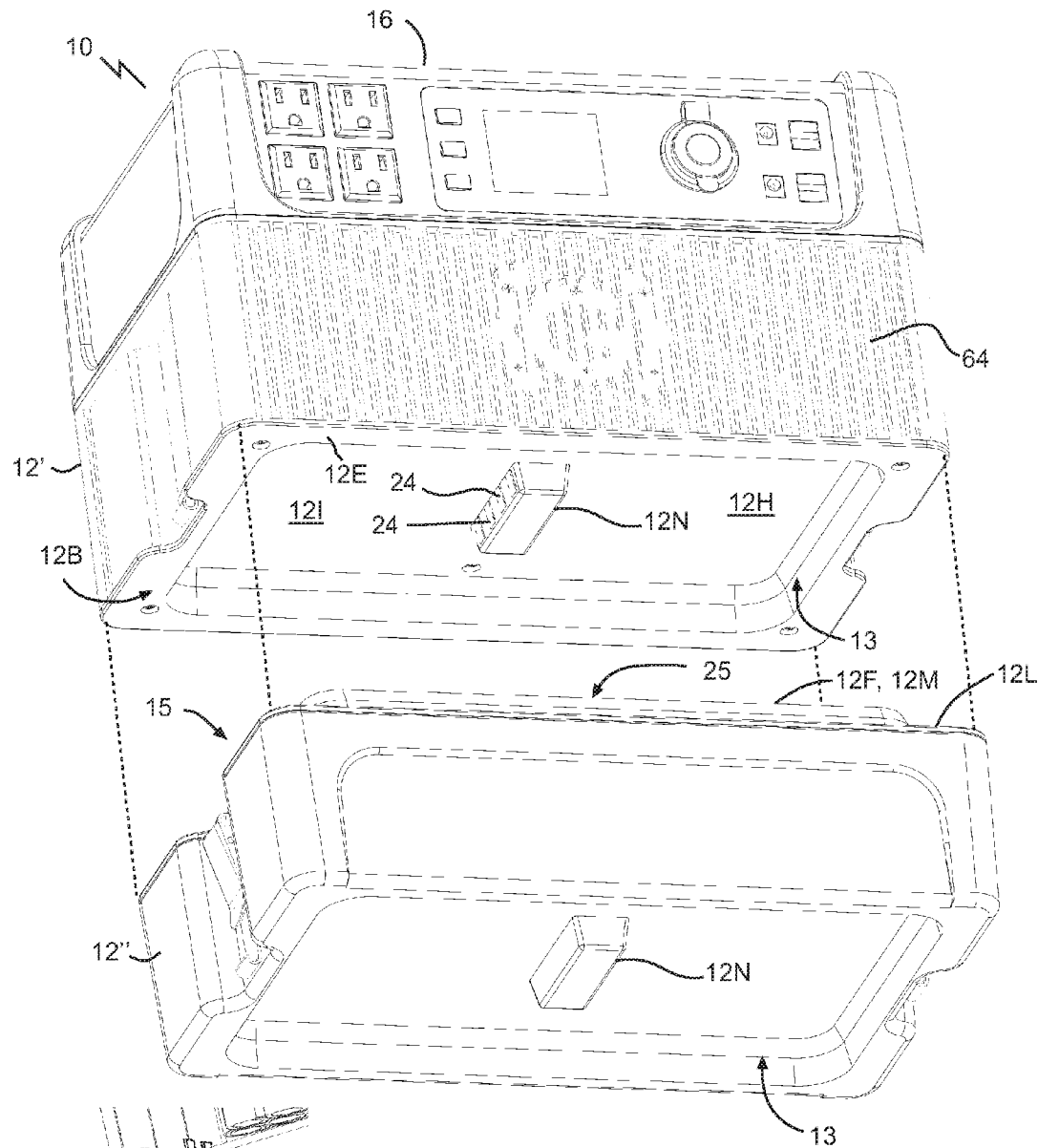
FIG. 15 is an exploded perspective view of the bottom seat of the control module and one of the battery modules of the modular energy storage system as shown in FIG. 1.

Referring to FIGS. 3, 10, and 15, seats 13 and 15 may have a suitable mating structure. Seats 13, 15 may have complimentary shapes, such as forming the inverse shape of the other as shown. Base face 12B may be indented to form a receptacle 12H, which may be encircled and in some cases defined by a peripheral rim 12E of the base face 12B. The receptacle 12H, and in the example shown the rim 12E, may define the bottom seat 13. Conversely, top face 12A may comprise a raised part 12F, for example a raised platform 12M, such as a planar horizontal surface, encircled by peripheral ledge 12L. In some cases, raised part 12F and peripheral ledge 12L define the top seat 15. Raised part 12F may be shaped to fit within the receptacle 12H of bottom seat 13, for example the seat of an adjacent battery module 12, control module 16 or other battery modules having a complimentarily shaped bottom seat 13, such as a speaker (not pictured). top part has raised wall that acts as a male connector for the larger depending female wall of the above module, to act as a seal. raised wall forms a planar top surface, with a small pool, with female connector defined in the center, for the male connector above to fit in. Alternative (not in the drawings)—The raised perimeter wall defines a pool, with a base lower than the upper rim of the perimeter wall, and in the center is a male electrical connector that extends upward to engage the female depending connector from the above module—a further protection for water ingress.

A seat to seat connection is understood to include the situation where a pair of parts form a mating connection that bears all or a substantial part of the weight of overlying components, facilitates electrical connections between parts, and forms a cohesive unit that is protected from relative lateral movement between parts. In some cases the bottom seat and the top seat, and the respective associated electrical connectors, are structured such that the respective associated electrical connects automatically mate if the bottom seat and the top seat, of the battery module and a second battery module, of identical construction as the battery module, were to mate together. Thus, no extra movements may be necessary to connect the modules 12 into electrical contact.

Figure 15A:
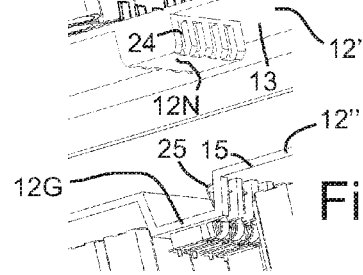
FIG. 15A is a close up perspective view, partially in section, illustrating an embodiment of the associated electrical connectors of a top seat and bottom seat of adjacent modules.

Referring to FIG. 3, the seats 13 and 15 may be structured to protect the associated electrical connectors. For example, seats 13 and 15 may be structured to act as a moisture barrier. Peripheral rim 12E, ledge 12L, raised part 12F, and receptacle 12H may collectively act as a moisture barrier when modules are stacked one on the other, for example to form a seal that prevents moisture ingress to connectors 24 and 25. Referring to FIGS. 3B and 15A, the associated electrical connector 25 of the top seat 15 may be located within a pool or female receptacle 12G, such as a contact retainer, in the raised part 12F. The associated electrical connector 24 of the bottom seat 13 may form a male part 12N, such as a contact retainer, that depends from the receptacle 12H of the base face. Each associated electrical connector 24, 25 may be located in a central part of the respective base face 12B or top face 12A. Centralizing the connectors 24 and 25 may act to maximize lateral distance from an exterior periphery of the system 10.

The seats 13 and 15 may have various other features. Referring to FIG. 3, a base end 19 of the male part 12N may sit above a plane 17 defined by the bottom seat 13, for example defined by peripheral rim 12E. Thus, when the bottom seat 13 rests upon a ground surface (not shown), the male part 12N is above the ground surface and out of contact with moisture on the ground surface, for example on a dew-covered lawn or in a boat. In other cases, the bottom seat 13 may form a part that depends from a peripheral ledge, and the top seat 15 may form a receptacle encircled by a peripheral rim. The bottom seat 13 may also have a female receptacle that mates with the male receptacle of the top seat 15.

Referring to FIGS. 3B and 15, each associated electrical connector 24, 25 may have suitable features. Each associated electrical connector 24 or 25 may comprise a plurality of associated electrical connectors. When the male part 12N and the female receptacle 12G mate, electrical connectors 24 and 25 may be in physical and electrical contact. In some cases, the associated electrical connector 24 of the bottom seat 13 is biased, for example spring biased, to contact an adjacent associated electrical connector, for example connector 25 of an adjacent battery module. Electrical connector 25 of the top seat, connector 24 of the bottom seat, or in some cases both electrical connectors 24 and 25 may be spring biased to contact an adjacent electrical connector. Electrical connectors 24 and 25 may comprise a suitable conducting spring, for example a leaf spring and others. Referring to FIGS. 3B and 15A, two different embodiments of connectors 24 are shown, and two different embodiments of connectors 25 are shown.

Referring to FIGS. 10, 11A, and 11B, electrical connectors 24 and 25 may be structured to permit modules 12 and 16 to mate about various angular orientations. Bottom and top seats 13 and 15, and associated electrical connectors 24 and 25, respectively, may be shaped to permit the battery module 12" to mount to an adjacent battery module 12' about a plurality of angular orientations relative to one another. The angular orientations may be defined about a stacking axis 86, which may be defined perpendicular to plane 17 defined by the bottom seat 13 (shown) or the top seat 15. The associated electrical connectors 24 and 25 may be structured to accommodate the plurality of angular orientations. In some cases the parts are structured to facilitate a discrete number of angular orientations, with the number of orientations being two or higher. In some cases the seats 13 and 15 will only match and mate in a correct orientation, to make the assembly of the system 10 foolproof. In the example shown, each module 12', 12" and 16 are structured such that the plurality of angular orientations include, for example consist of, a pair of positions that are 180 degrees apart relative to one another about the stacking axis 86. Thus, each module 12 or 16 may be rotated 180 degrees about axis 86 and still mate with an adjacent module. Referring to FIG. 3B, an example is shown where electrical contacts (electrical connectors 25 line both sides of receptacle 12G, to mate with contacts (electrical connectors 24) lining one side of male part 12N. Referring to FIG. 15A, an example is shown where electrical contacts (electrical connectors 25 line one side of receptacle 12G, to mate with contacts (electrical connectors 24) lining both sides of male part 12N. Both embodiments achieve 180 degrees of orientation variability.

Figure 2:
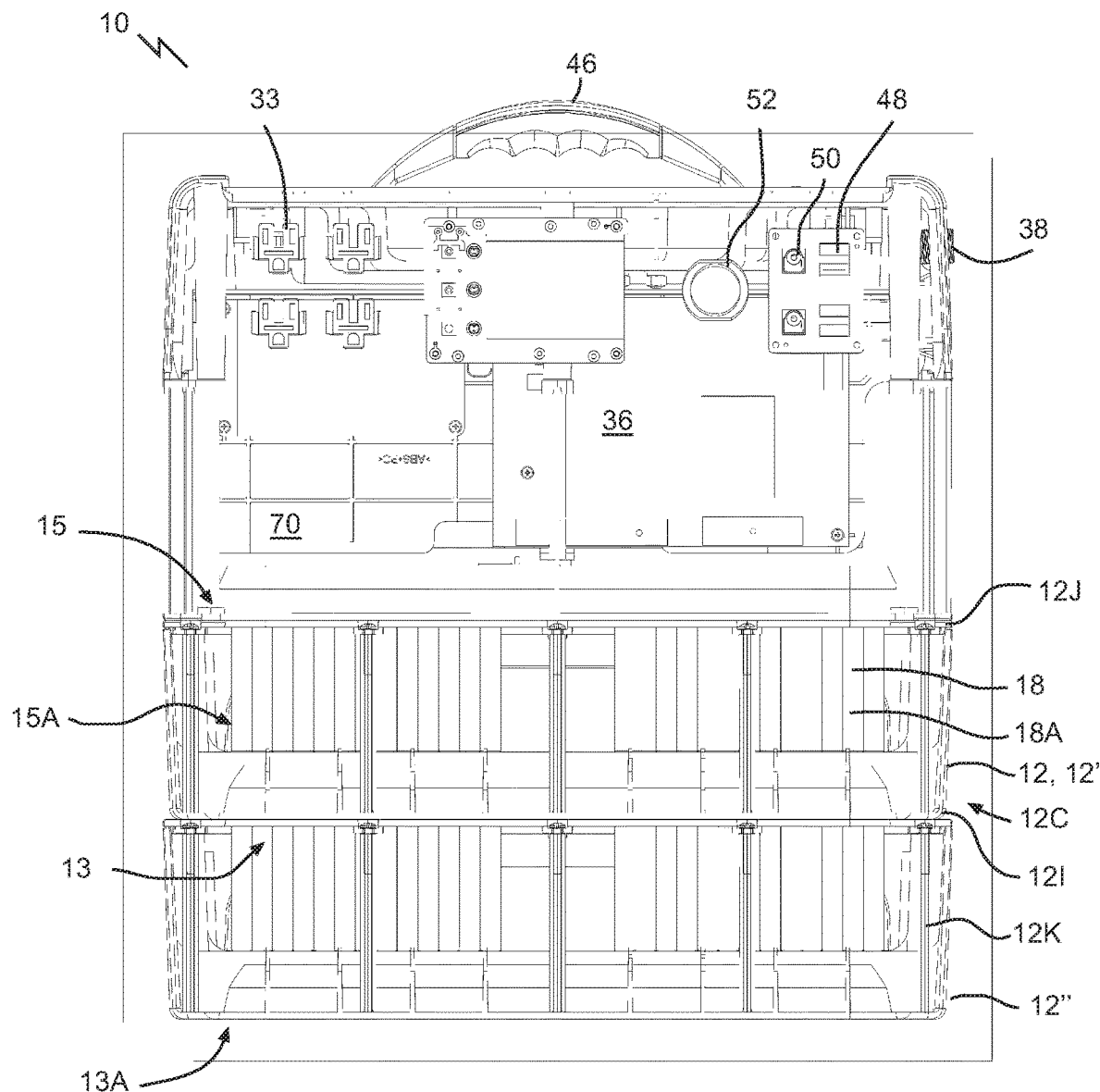
FIG. 2 is a section view taken along the 2-2 section lines in FIG. 1A.
Figure 2A:
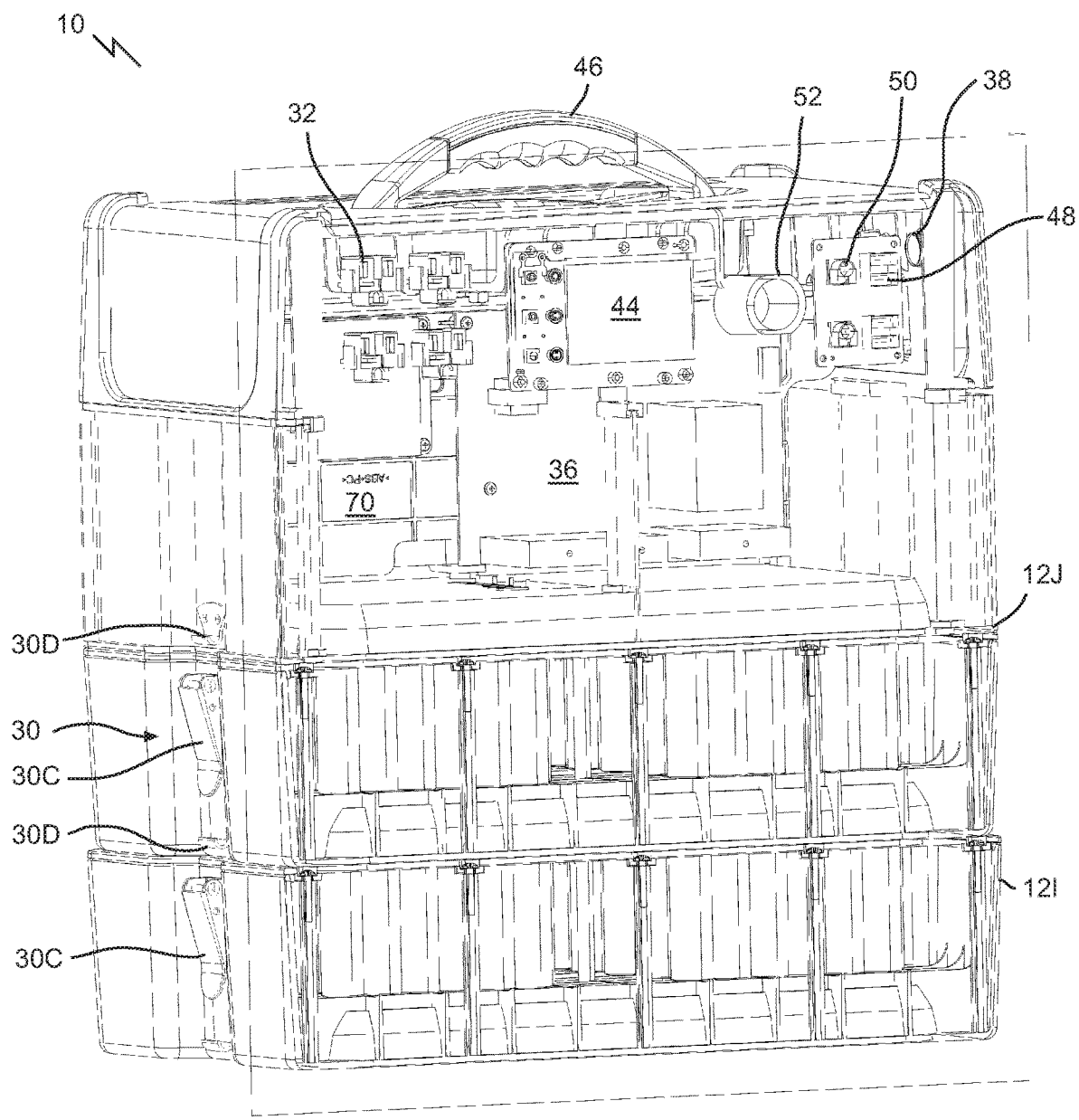
FIG. 2A is a perspective view of the portion of the modular energy storage system as shown in FIG. 2.

Referring to FIGS. 2A and 10, modular energy storage system 10 may comprise locking parts 30 to secure modules to one another. Locking parts may secure the one or more battery modules 12 to one or both of each other and in the example shown a module 12 to the control module 16.

Locking parts 30 may lock modules together to form a secure, stable stack of parts, for safety purposes, functionality, and/or transportation purposes. Locking parts 30 may comprise latches, for example over the center latches, which may have a cam arm, such as formed by hinged cam arm 30B and loop 30C (FIG. 10), for securing against a suitable latch connector, such as hook 30D. Other suitable locking parts may be used, including snap fit locking parts, interference fit locking parts, tabs, loop and hook fasteners, cam locks and others. In some cases, the modules may automatically lock to one another upon stacking. For example latches may be provided that automatically latch on contact, and are released upon depression of a latch release button (not shown).

Figure 6:
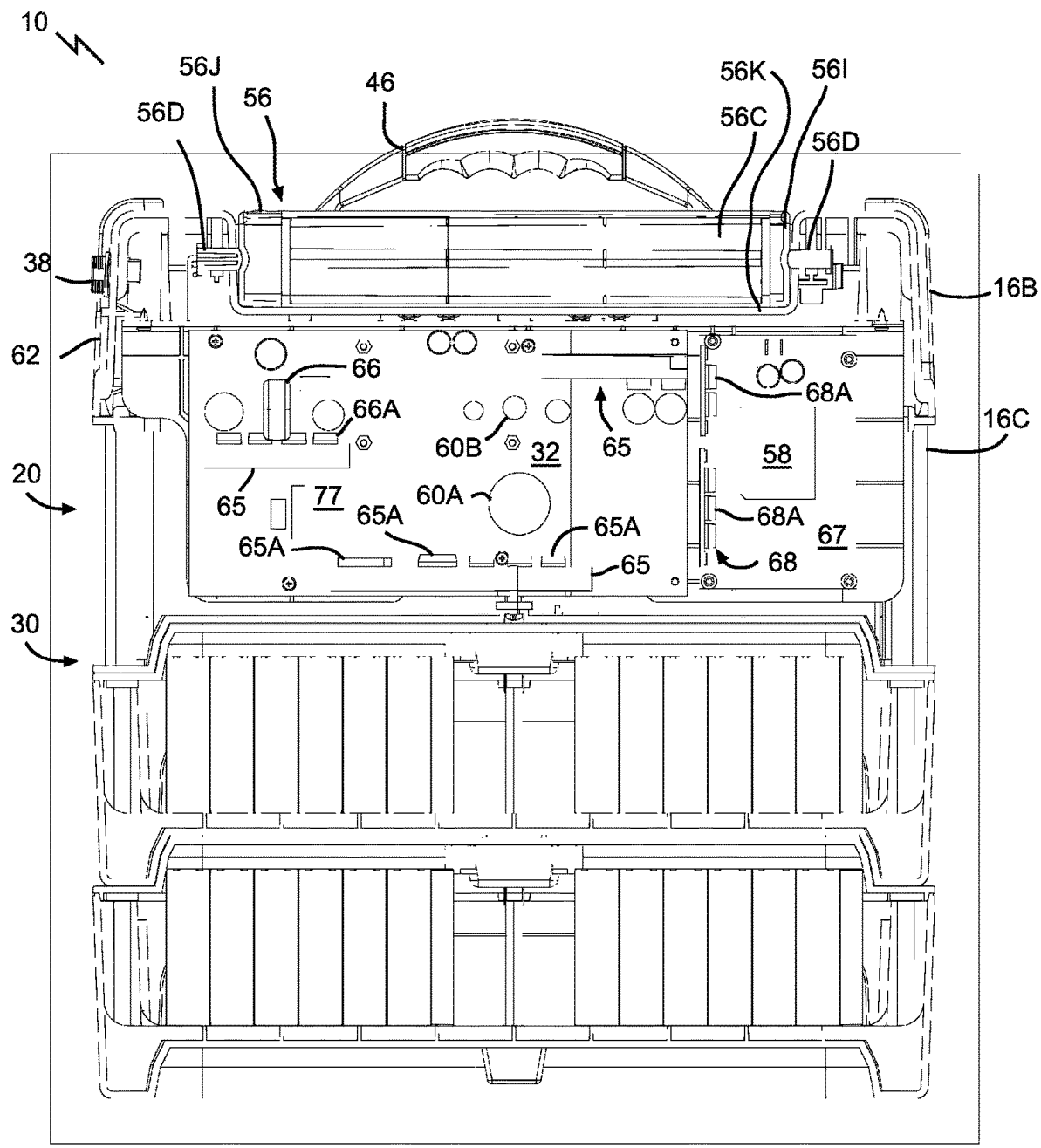
FIG. 6 is a section view taken along the 6-6 section lines in FIG. 1A.

Referring to FIGS. 6, 9 and 9A, the battery module 12 may have suitable components. The battery 18 may comprise plural cells 18A, for example lithium ion cells, linked together in a suitable configuration, and connected to one or both of connectors 24 or 25 in order to receive and discharge electricity through such connector. The battery 18 may be rechargeable. Battery materials may be used other than lithium ion, for example lead acid, although lithium ion batteries are lighter than lead acid. Various aspects of the battery 18 and internal circuitry 21 may be adjusted to tailor the characteristics of the module 12, for example the number and size of cells 18A may be selected, and the arrangement of electrical linkages 21A (parallel, serial, or combinations of both) may be selected, to achieve a desired result, such as a desired watt-hours, amperage, and voltage of the module 12. Some cells 18A may be grouped in series, and others in parallel. In one case 120 3.7V cells are separated in two groups of equal numbers of cells, with the cells within each group connected in series, and the groups connected in parallel. A suitable battery module 12 may produce 48V and 1200 watt hours fully charged, although other settings may be used, such as those configured to produce 12V, 24V, 72V, 1000 W, 4200 W, 7200 W and other output characteristics higher or lower than such values. In cases where the control module 16 independently charges each module 12, the battery 18 may be electrically connected to module 16 through connector 25 only. In cases where the battery 18 of one module 12 is electrically connected to module 16 and the battery 18 of another module 12, the battery 18 may be connected to both connectors 25 and 24.

Referring to FIGS. 3, 3A and 8, one or more battery modules 12 may be charged or discharged selectively by control module 16. When assembled and stacked, control module 16 may have dedicated or independent circuits to each module 12 and control module 16 may be connected to independently charge and discharge the battery modules 12. In such a case, each battery module 12 is independently wired to charge and discharge without affecting the charging and discharging of other modules 12 in the stack. Independent charging may be achieved by isolated circuits. Independent charging may limit the number of modules 12 that may be stacked, as each independent circuit may require a dedicated pair of electrical connectors 24 and 25 at each module to module junction up to the target module. However, independent charge and discharge capability allows a user to select a particular battery module 12 to drain or charge, irrespective of the charging state of the other modules 12.

Referring to FIG. 8, in some cases the batteries 18 of modules 12 may be connected, for example in series or in parallel. In such a case, batteries 18 may be connected to form an equalizing circuit with the internal charge-and-discharge electrical components 20. An equalizing circuit equalizes the voltage and amperage supplied by each battery 18, such that during use if one battery 18 has a higher charge than another battery 18, the higher charge battery acts to charge the lower charge battery 18 until both batteries 18 have equal charge. In some cases, the module 16 may switch between independent charging and discharging of each battery 18, to equalizing charge between batteries 18, for example using switching mechanisms. Equalization can be disadvantageous where one battery 18 is damaged or of relatively lower power storage capacity than the other batteries 18. In some cases module 16 may be manually programmed, for example by user input on a keypad, to isolate certain battery modules 12 from use, or to select one or more other modules 12 for use.

Figure 4:
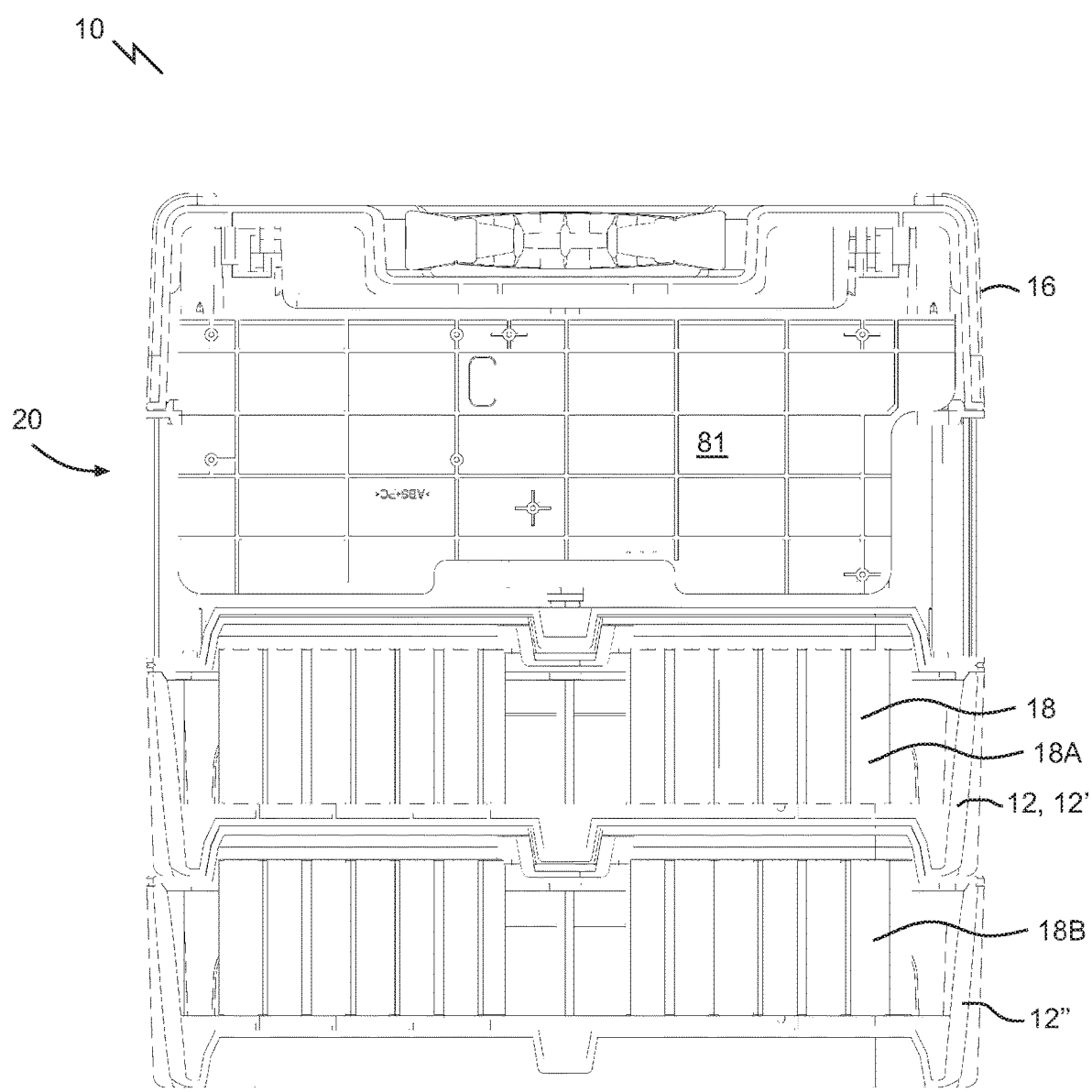
FIG. 4 is a section view taken along the 4-4 section lines in FIG. 1A.
Figure 5:
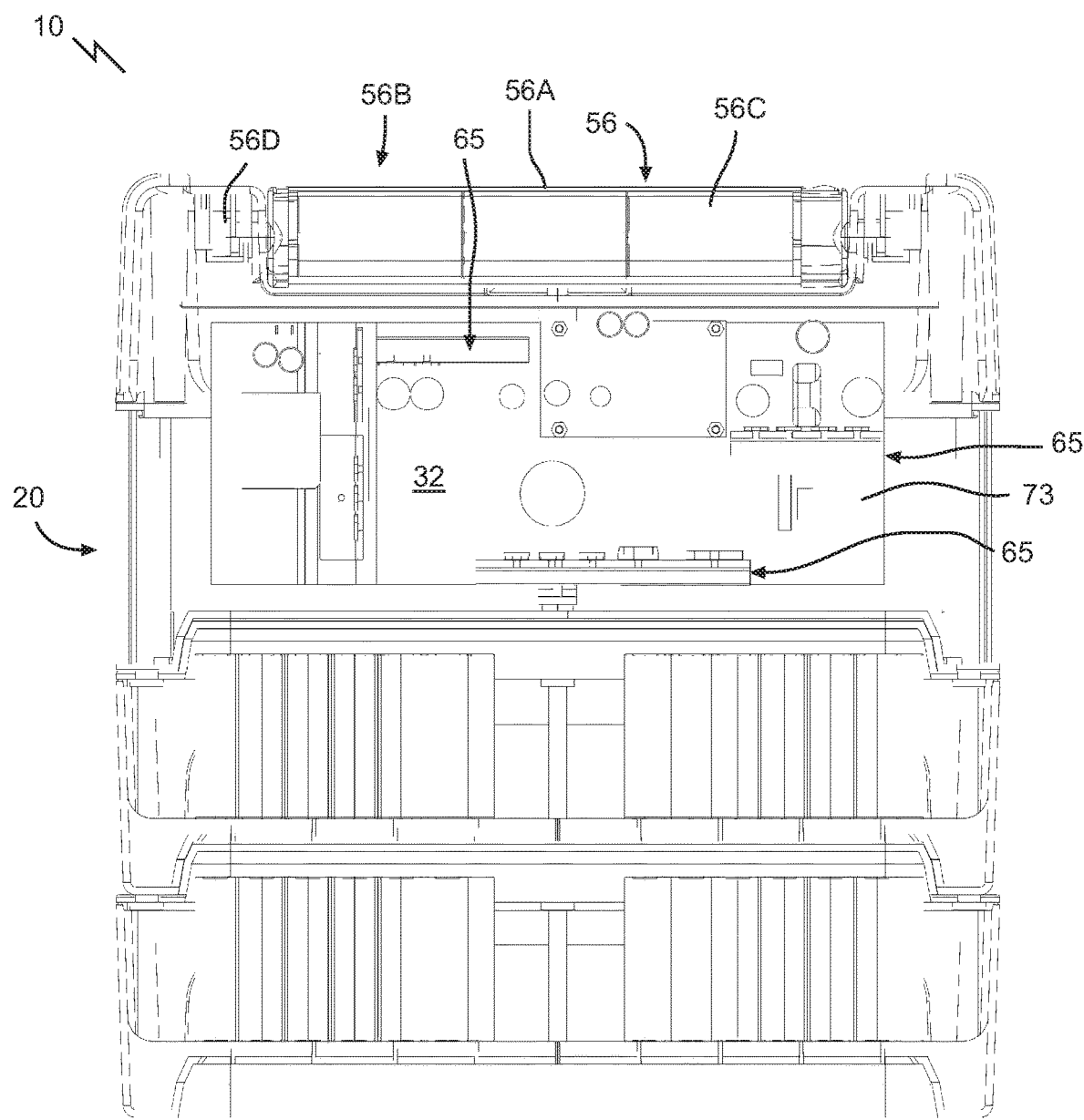
FIG. 5 is a section view taken along the 5-5 section lines in FIG. 1A.
Figure 5A:
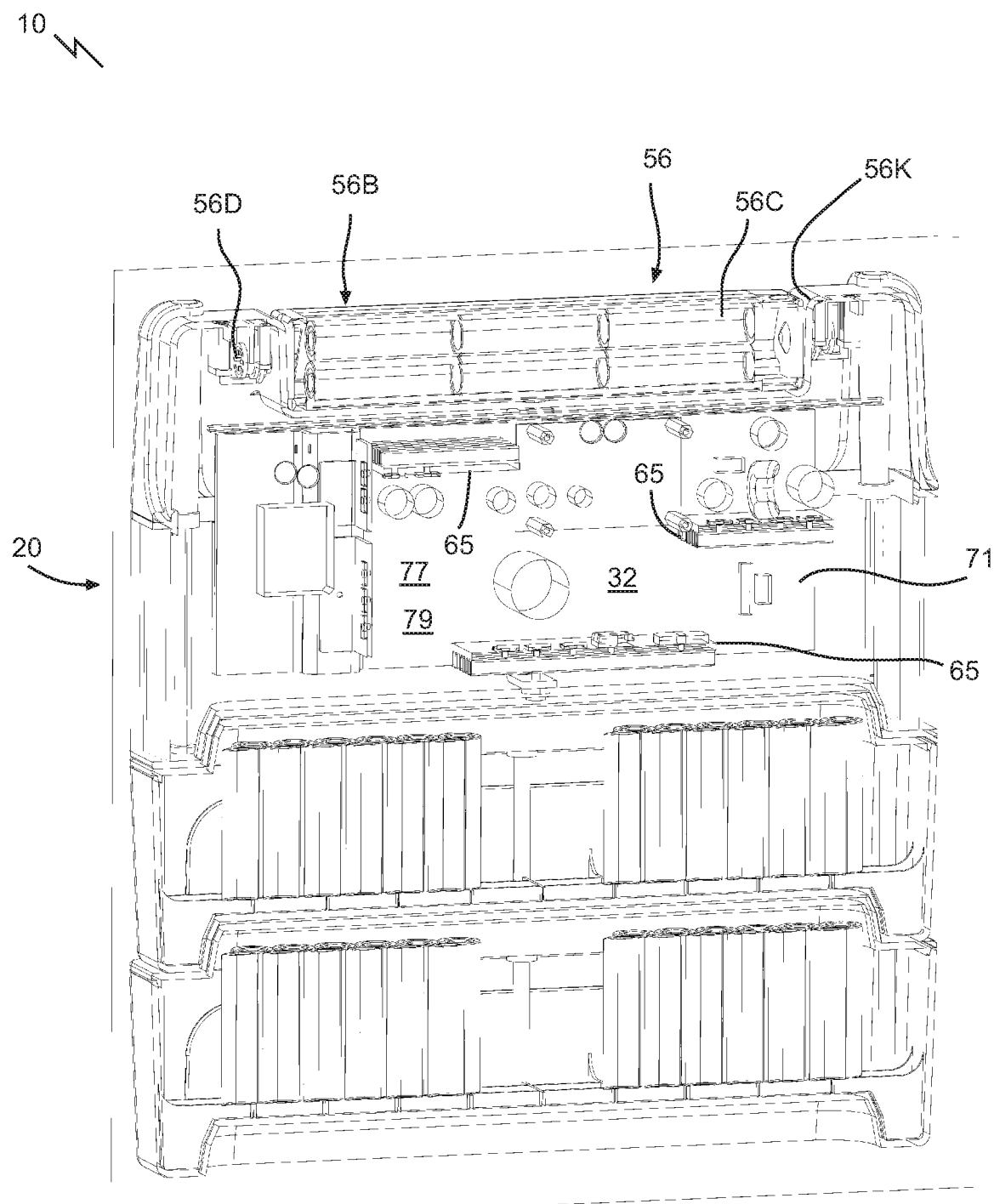
FIG. 5A is a perspective view of the portion of the modular energy storage system as shown in FIG. 5.

Referring to FIGS. 4-5A, battery modules 12 may be added indefinitely to the top or bottom of the stack as needed. One or more battery modules 12 may mount on other battery modules 12 or control module 16. In some cases, first battery module 12' is mounted below the control module 16, with the associated electrical connector 25 of the top seat 15 connected to the internal charge-and-discharge electrical components 20 of module 16. First battery module 12' may be mounted above control module 16 with the electrical connector 24 in the bottom seat 13 connected to the components 20. Control module 16 may comprise a bottom seat 16A that mounts the top seat 15 of the first battery module 12'. Control module 16 may comprise a top seat (not pictured) for mounting a battery module, for example mounting bottom seat 13. Control module bottom seat 16A or top seat may have the same shape as the top seat 15 or bottom seat 13, respectively, of the first battery module 12' In some cases, any number of modules, such as battery module 12, with a compatible structure for seat 13 or 15 and compatible electrical connector 24 or 25 can be added to the stack. Battery modules 12 may be daisy chained together.

Referring to FIG. 3A, each of modules 12', 12", and 16 may have compatible, and in some cases identical, electrical connections, for example seats 13 and 15. Thus, although seats 13 and 15 are primarily described in this document with reference to battery modules 12, it should be understood that module 16 may also have an identical or complimentary seat 13 or 15, or both in some cases if modules 12 are to be stacked above and below the module 16. Any feature described for a seat 13 and 15 in this document is applicable to the control module 16. In the example shown the control module 16 has a bottom seat 13 and associated electrical connector 24 that mates with the top seat 15 and associated electrical connector 25, respectively, of the battery module 12.

Figure 6A:
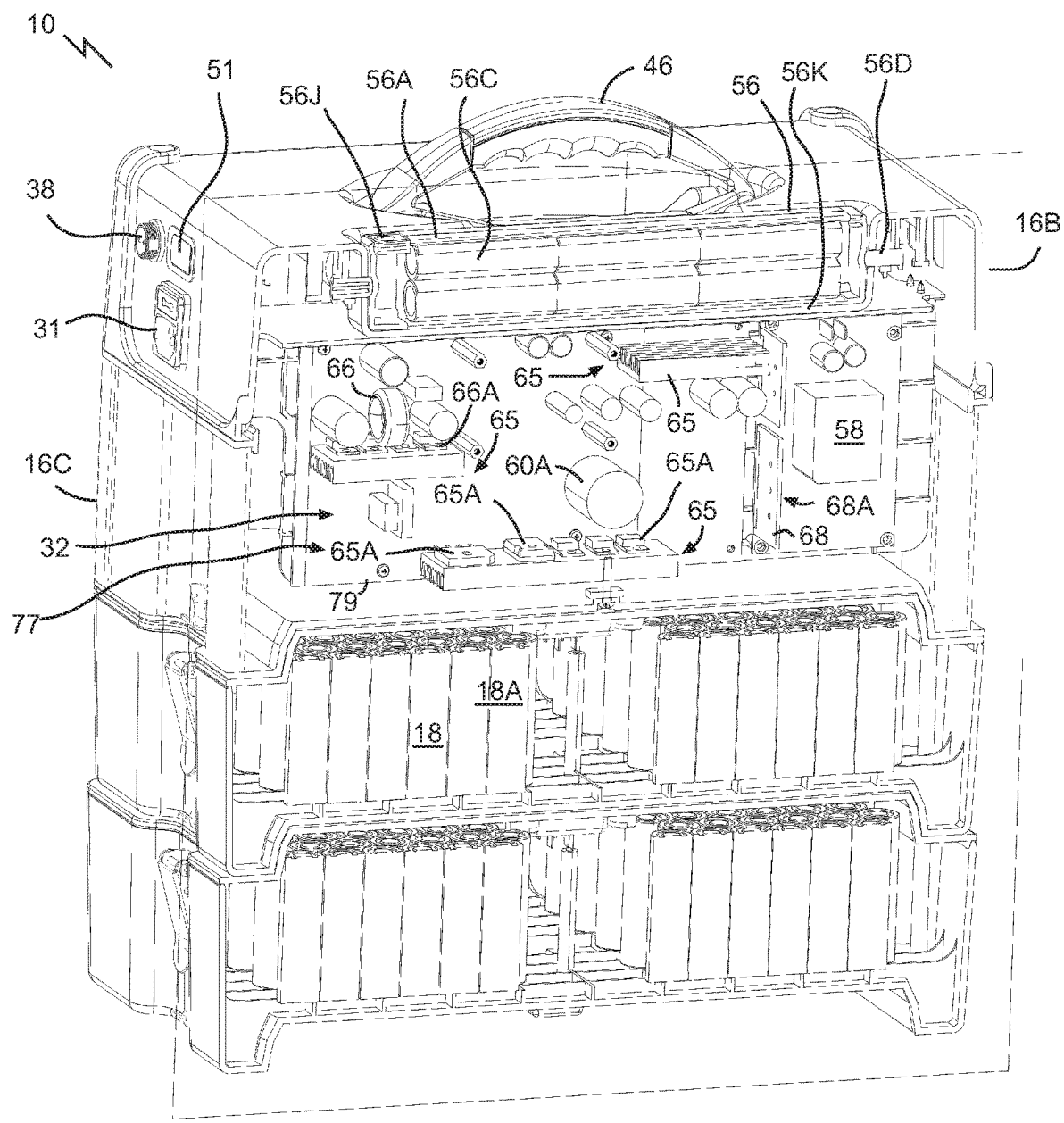
FIG. 6A is a perspective view of the portion of the modular energy storage system as shown in FIG. 6.

Referring to FIGS. 5-5A, 6-6A, and 9-9A, the internal charge-and-discharge electrical components 20 may comprise an inverter 32. An inverter transforms a direct current (DC), such as a low voltage DC current (such as 9 or 12 volts) to an AC current, such as a high voltage AC current. Converting DC to AC is more complicated than AC to DC, and hence an inverter is a relatively complex and expensive circuit compared to a rectifier, which converts AC to DC and typically has only a few simple parts. Referring to FIGS. 3A and 5A, an inverter 32 may comprise an onboard microcontroller, such as a printed circuit board (PCB) 36 and 36F (FIG. 3A, 36F also being an integrated circuit), which rapidly switches on and off power to plural metal oxide field effect transistors (MOSFETs), such as MOSFETS 65A, 66A, and 68A (FIG. 5A) at high frequency, such as 50 kHz. Each MOSFET may directly pull from a relatively low voltage DC source such as battery 18 (not shown). Referring to FIGS. 3 and 3A, the signal may pass through step-up transformers 36A, 36D, 36G, and 58, which may generally be plural small transformers placed in parallel to reduce the overall size of the inverter 32 instead of one large transformer, to produce a higher voltage signal. Referring to FIGS. 6 and 6A, the output of the step-up transformers may be filtered by various capacitors 60A to produce a high voltage DC supply. Finally, the high voltage DC supply may be pulsed with additional power MOSFETs by the microcontroller to produce the final modified, square, or pure sine wave signal. Inverter 32 may be a suitable inverter, such as a 1000 Watt pure sine wave inverter. Various other components may be used with inverter 32. For example a PCB protector or lithium cell control module 36D (FIG. 3A), a PCB charger 67 (FIG. 6), a coil filter 66 (FIG. 6A), and others may be incorporated.

Figure 7:
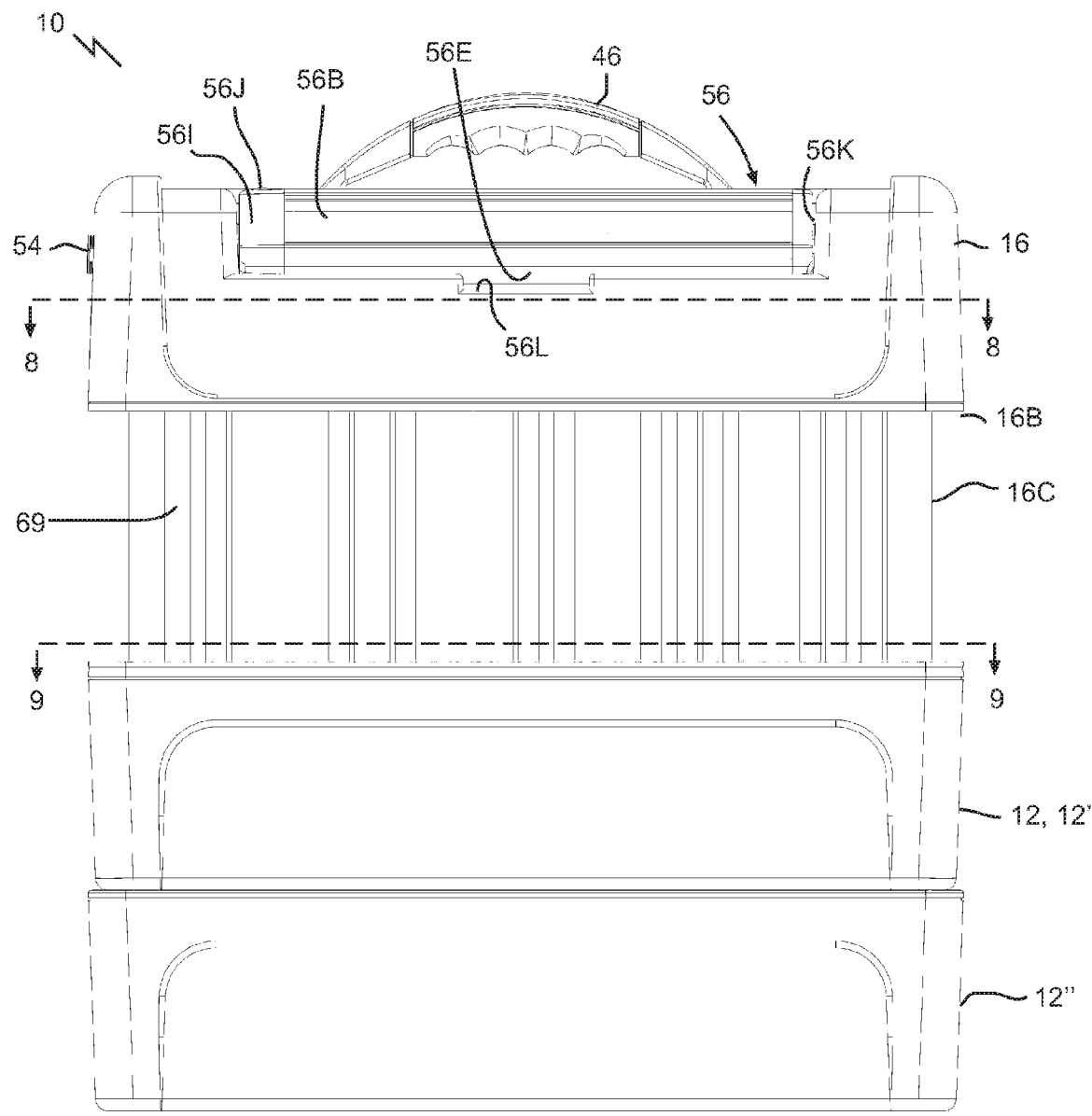
FIG. 7 is a rear end view of the modular energy storage system shown in FIG. 1.

Inverter 32 may have a suitable mechanism for cooling internal components, to dissipate heat produced during operation. Referring to FIGS. 5A, 6A, and 8A, the control module 16 may comprise a heat sink, such as formed by one or more of heat sinks 36B, 65, 71, 73, and 64 connected to the inverter 32. Referring to FIGS. 7 and 8, one or more heat sink, such as heat sink 64, may form an external surface of the control module 16, to dissipate heat from the internal components module 16 to the ambient environment. Heat sink 64 may at least partially encircle the inverter 32, and the module 16 in the example shown, in order to maximize the release of heat during operation of system 10. In the example shown heat sink 64 wraps circumferentially around the module 16. Referring to FIG. 8A, the heat sink may comprise one or more plates 71, 73, which connect an internal part 77 of the heat sink to an external part, such as heat sink 64, that forms an external surface of the control module 16.

Figure 4A:
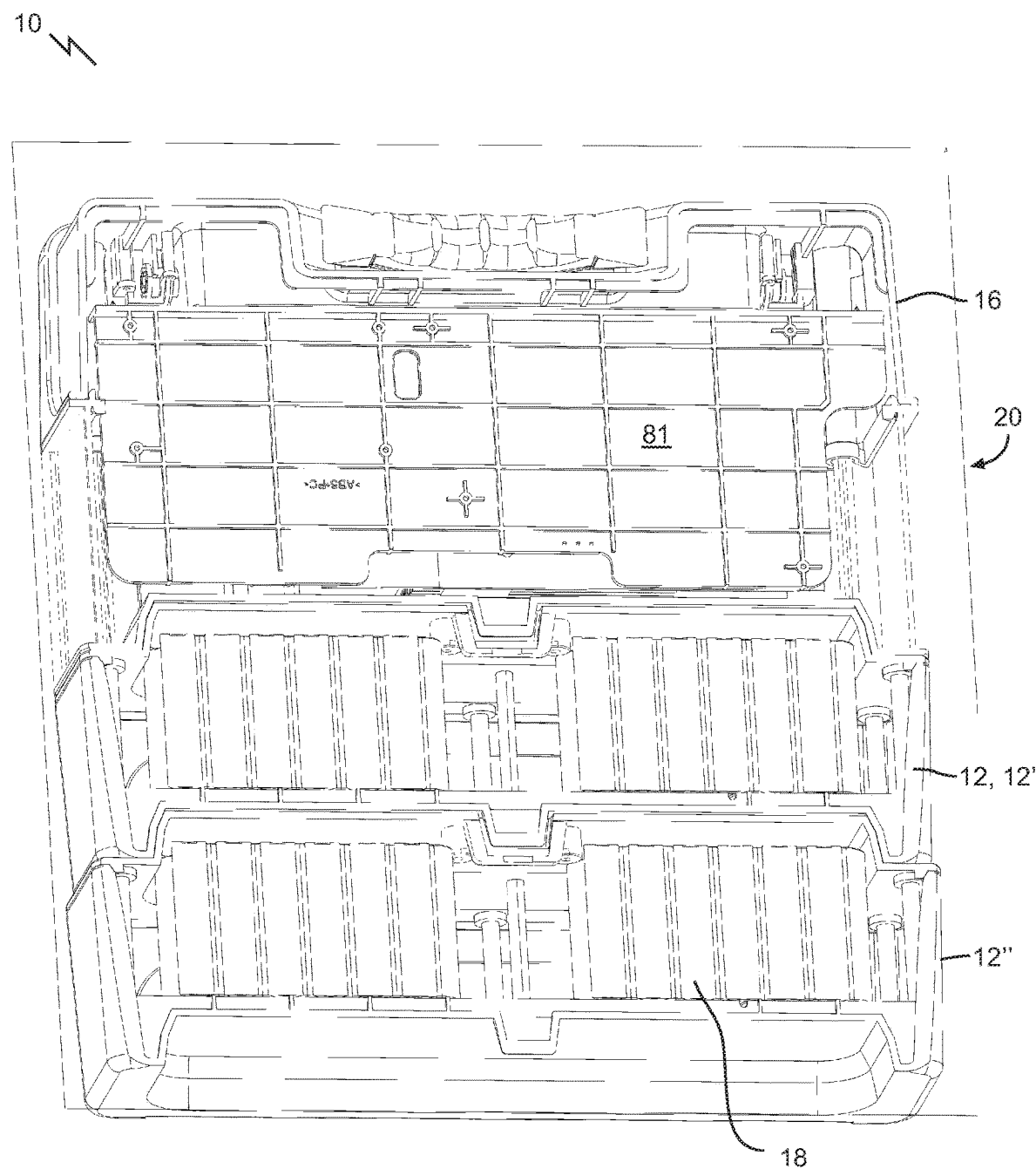
FIG. 4A is a perspective view of the portion of the modular energy storage system as shown in FIG. 4.

Heat sink 64, or other of the heat sink parts in inverter 32 or module 16, may be formed by suitable heat releasing structures, such as fins or corrugations. Heat sinks may be made out of thermally conductive material, such as metals or other materials with a thermal conductivity of 10 W/(m·K) or higher, such as 100 W/(m·K)] or higher. Aluminum may be used to form heat sink 64. The inverter 32 may be a fanless inverter, which may reduce the noise produced by the system 10 during operation. Referring to FIGS. 5A, 6A, and 8A, the heat sink parts that form the internal part 77 of the heat sink, such as heat sinks 65, plates 71, 73, and 36B, may form part or all of an internal structural frame 79 of the inverter 32. The structural frame 79 may support and mount the various components of the inverter 32 as needed, and may include other non-heat sink parts such as a plastic support board 81 (FIGS. 4 and 4A). Referring to FIG. 6, the internal part 77 may mount metal oxide field effect transistors (MOSFET) 65A of the inverter 32, and the internal part 77 and the external part, such as heat sink 64, may be formed of thermally conductive materials in thermal communication with one another to dissipate heat efficiently from the inside to the outside of module 16. The MOSFETs create a relatively large amount of heat during operation, and hence in the example shown such MOSFETS are mounted on finned heat sinks 65. Other cooling devices may be used to dissipate heat from control module 16. For example active or passing cooling systems, such as fans, liquid cooling, heat pipes and others, may be used.

Referring to FIGS. 1 and 9, internal charge-and-discharge electrical components 20 in control module 16 may have a variety of power inlets 31. Referring to FIG. 9, power inlet 31 may connect to PCB 36 via a power adaptor 72, and suitable wires 92, 114, and 116. Inverter 32 may be connected to the power inlet 31, for example via PCB 36. PCB 36 may contain suitable components to convert AC to DC, such as a rectifier (not shown). Power inlets 31 may be connected to a power source 11, such as a 70 W AC wall plug, and may provide current to battery modules 12. Power inlet 31 may include an AC plug of a suitable voltage, for example 120V-240V. Referring to FIGS. 6A and 9, in some cases, system 10 is charged from an external battery, such as a car battery through a suitable connector.

Referring to FIG. 9, system 10 may be charged via a solar panel 40 (FIG. 8) through solar plug 38. Control module 16 may be connected, for example via a solar or photovoltaic (PV) plug 38, to receive current from a solar power collector, such as a solar panel 40. A solar PV collector may recharge the battery modules 12 and thereby make the entire operation of system 10 emission-free. Solar power is the conversion of sunlight into electricity, either directly using photovoltaics (PV), or indirectly using concentrated solar power. Concentrated solar power systems use lenses or mirrors and tracking systems to focus a large area of sunlight into a small beam. Photovoltaic cells convert light into an electric current that may be used for other purposes, such as to power portable devices.

Referring to FIGS. 1 and 9, control module 16 may comprise various power outlets 33 to discharge current from battery modules 12. Power outlets 33 may comprise one or more outlets of AC and DC voltages. For example, universal serial bus (USB) ports 48 and DC 12V 6 mm ports 50 may be mounted to a DC output board 74, which connects to PCB 36 via wires 100 and 98. A DC 12.6V car cigarette lighter socket 52 may connect to PCB 36 via wires 102. Referring to FIG. 6A, a jump starter outlet 51 may also be provided. A jump starter output may be used to jump start a dead battery in a vehicle, such as a car. Referring to FIGS. 1 and 9, one or more AC outlets 26 may be provided, via wires 94 connected to PCB 36. Power outlets may be used to power devices such as TVs, power tools, stereos, fans laptops and others. Stackable energy system 10 may provide a cordless alternative to powering devices and may permit the use of such devices in locations where access to an electrical source is otherwise difficult.

Referring to FIGS. 1 and 9, modular energy storage system 10 may comprise a user control or status display device, such as an LCD display panel 44. Depression of an on off button may initiate and shut off the system 10. Display panel 44 may be configured to display one or more characteristics of the system 10, such as the charge status of the battery modules 12, or for displaying if batteries 18 are connected or disconnected. Display panel 44 may also display the level of charge in the one of more battery modules 12. Display panel 44 may be configured to enable the user to select a variety of operating modes via a plurality of buttons 42, which may be mounted with display panel 44 on a screen and control board 80. Buttons 42 may include a power on/off button for system 10, a DC power on/off button, and an AC power on/off button. Wires 96 may connect board 80 with PCB 36.

Referring to FIG. 9, the PCB 36 may be connected during use to charge and discharge the battery modules 12' and 12". Wires 110 and 108 may connect to the first battery module 12', for example to a PCB 76 that makes up part of the internal circuitry 21 of the module 12'. Wires 110 may be provided as a serial connection for communication or grounding. Wires 108 provide for power transmission to the batteries 18 of the modules 12. The battery PCB 78 coordinates with the respective battery 18 to charge and discharge current to and from battery 18. Wires 106 and 104 connect to PCB 76 of the second battery module 12", with PCB 76 of module 12" functioning in the same fashion as PCB 76 for module 12'. Wires 104 are power lines, and wires 106 are communication or ground lines similar to wires 108 and 110, respectively. Wires 104, 106, 108, and 110 are parallel connections in the example shown.

Referring to FIGS. 6, 6A, 7, 9, and 13, control module 16 may comprise a removable flashlight 56. Referring to FIG. 9, flashlight 56 may be reversibly mounted to the control module 16 and when mounted may be connected to the components 20, for example via wires 112 to PCB 36. Referring to FIG. 7, flashlight 56 may comprise a housing 56A that is embedded within a correspondingly shaped recess 56K in the external surface of the module 16 when in a stowed position shown. A pivot part may be provided for adjusting the angle of a lens 56B. Referring to FIGS. 6, 6A, 7, 9, and 13, electrical negative and positive connectors 56D may be integrated with the module 16 to secure to flashlight 56, or a part of flashlight 56 such as end cap 56I, by a suitable reversible attachment mechanism, such as friction fit, interference fit and others, and to charge a battery 56C (FIG. 6) of the flashlight 56. Flashlight 56 may also charge by an inductive contactless process. Flashlight 56 may comprise an indented ledge 56E, or module 16 may include a finger recess 56L, or recess 56H and ledge 56E may be present together, to allow for a user to grip and detach flashlight 56 from module 16 with sufficient force.

Flashlight 56 may have an internal power source, for example rechargeable batteries 56C, that power the flashlight 56 after detachment from control module 16. Batteries 56C may be recharged by the battery modules 12 and components 20 while the flashlight 56 is mounted on the module 16. A control button, such as an on/off button or other buttons 56J may be provided on flashlight 56. In use, the flashlight 56 may be detached from the control module 16 and used as needed, for example in a recreational or work vehicle, used for the night and plugged back into control module 16 to recharge the power source such as battery 56C during the day, or in other situations.

Referring to FIGS. 12A-C, flashlight 56 may be structured to be placed in various positions for flexibility of use, and to emit light in various directions. External walls 56F, 56G, and 56H may be angled with respect to one another and with respect to lens 56B, and may form planar surfaces of sufficient dimensions to support the flashlight stably when each of said walls is positioned on a surface 90.

Referring to FIG. 13, a further embodiment of a stackable energy storage system 10 is depicted with control module 16 and battery modules 12. Storage system 10 may comprise a housing 85 with a plurality of module compartments 87. Battery module 12 may have a structure that permits sliding of module 12 into one of the compartments 87. Modules 12 may slide laterally into the compartment 87 and have a lock 88 that drops the connector 24, 25 into engagement or in some cases, raise module 12 into engagement with other modules. In some cases, storage system 10 resembles a server rack. A control module (not shown) may form part of the system 10, or may fit into one of the compartments 87. Battery modules 12 may be removed once charged and taken to a remote site for use, or may be discharged while connected to the system 10.

System 10 may have various other suitable features. In some cases, module 16 comprises BLUETOOTH™ compatible speakers, which may be detachable or integrated into the housing 16B. Referring to FIG. 1, control module 16 may comprise a handle 46. Handle 46 may provide a gripping point for users and increase the portability of modular energy storage system 10. Handle 46 may define a plurality of recesses 46A sized to receive fingers of a user when gripping handle 46.

Use of battery modules 12 as a power source may provide an emission-free source of energy that may be used for applications such as recreational vehicle (RV), camping, acreage, industrial, residential, oil and gas, field operations, trade shows and others. Modular energy system 10 may be run inside enclosed spaces, for example trade shows and weddings, due to the lack of emissions. Energy system 10 may also run at subzero temperatures, for example −5° C., −10° C. and lower. Damaged or low utility battery modules 18 may be replaced by fresh battery modules 18 in some cases. More than two battery modules 12 may be connected, for example three, four, five, six, or more. Each battery module 18 may form a bucket with a lid that contains the batteries 18 inside. Examples uses for system 10 include AM/FM Radio, lights, laptop/computer, RV fridge, cellphone chargers, air compressor, portable heater, drill, jigsaw/circular saw, TV/DVD player, CPAP machine, fans, electric blanket, heat lamp, blender, pumps, deep freeze, and projector. Referring to FIG. 15, the base face 13 of the base module 12" in the stack may be sealed, for example if male part 12N lacks connectors 24 and apertures to the inside of the module 12"

Table 1 below details specifications for two examples of system 10 within the disclosure here.

| Battery | Net Weight | 5.6 Kg | 11.3 Kg |
| --- | --- | --- | --- |
| | Battery capacity | 440 Wh | 1200 Wh |
| | Type | Lithium Ion | Lithium Ion |
| Charging | AC Charging | 100-240 V 7 hours charge | 100-240 V 6.5 hours charge |
| | DC Charging (car) | 12 V 10 hours charge (48 W) | 12 V 22 hours charge (48 W) |
| | Solar | 6 hour charge (optimal conditions) | 10 hours charge (optimal conditions 210 W/4 A) |
| Output | AC 120 V | 300 W (600 W Peak) | 500 W (1000 W Peak) |
| | DC | USB × 4, auto accessory x2 | USB × 4, auto accessory x1 |
| Discharging | Output voltage | 120 ± 3% VAC | 120 ± 3% VAC |
| | Output frequency | 50/60 HZ ± 0.5 | 50/60 HZ ± 0.5 |
| | Over load ability | 120% 10 S | 120% 10 S |
| | Discharge time | 4 h (250 W) | 4 h (250 W) |
| | Output wave form | Pure sine wave | Pure sine wave |
| | Converter efficiency | ≥92% | ≥92% |
| | MPPT efficiency | ≥98% | ≥98% |
| | DC car cigarette plug | DC12 V/6 A | DC12 V/6 A |
| Protection | Short-circuit | YES | YES |
| | Low voltage protection | YES | YES |
| | Over voltage | YES | YES |
| | Over temperature | ≥50 shutoff | ≥50 shutoff |
| | Irregular input | | Avoid self-discharge on unstable current |
| | Battery recovery | | Trickle current on low V |

-continued

|  | Battery balancing | No | Balancing for battery pack during charging |
| --- | --- | --- | --- |
| Operation | Working temperature | 40 C. to −40 C. | 40 C. to −40 C. |
|  | Humidity | 10%-90% | 10%-90% |
| Options | Car Jump Start | Yes | Yes |
|  | Light | No | Removable LED bar |
|  | Stackable battery | No | Yes |

In the claims, the word "comprising" is used in its inclusive sense and does not exclude other elements being present. The indefinite articles "a" and "an" before a claim feature do not exclude more than one of the feature being present. Each one of the individual features described here may be used in one or more embodiments and is not, by virtue only of being described here, to be construed as essential to all embodiments as defined by the claims.

The embodiments of the invention in which an exclusive property or privilege is claimed are defined as follows:

1. A modular energy storage system comprising:
a battery module with a battery and internal circuitry;
a control module with a power outlet, internal charge-and-discharge electrical components, and a power inlet for connection to a power source in use;
the battery module defining a top seat that has an associated electrical connector;
the battery module being mounted to the control module below the control module by the top seat, whose respective associated electrical connector connects to the internal charge-and-discharge electrical components to permit the control module to:
charge the battery module with power from the power source; and
discharge the battery module by transferring power from the battery module to the power outlet;
the battery module defining a bottom seat with an associated electrical connector;
the battery module having a housing formed by a sidewall, a base defining a base face, and a roof defining a top face;
the bottom seat being defined by the base face and the top seat being defined by the top face;
the battery module being structured such that if a second battery module that is structurally identical to the battery module were stacked below the battery module, the bottom seat and associated electrical connector of the battery module would mate with the top seat and associated electrical connector, respectively, of the second battery module, with the battery module being adapted to transfer current between the control module and the second battery module to permit the control module to charge and discharge both the battery module and the second battery module.

2. The modular energy storage system of claim 1 further comprising a second battery module, with a top seat and an associated electrical connector, in which the second battery module is mounted to the battery module below the battery module, with the bottom seat and associated electrical connector of the battery module mating with the top seat and associated electrical connector, respectively, of the second battery module, to permit the control module to charge and discharge the battery module and the second battery module.

3. The modular energy storage system of claim 2 in which the control module is connected to independently charge and discharge the battery module and the second battery module.

4. The modular energy storage system of claim 2 in which:
the second battery module defines a bottom seat with an associated electrical connector; and
the bottom seat of the second battery module is structured such that if the battery module were stacked below the second battery module, the bottom seat and associated electrical connector of the second battery module would mate with the top seat and associated electrical connector, respectively, of the battery module, to permit the control module to charge and discharge the battery module and the second battery module.

5. The modular energy storage system of claim 4 in which the battery module and the second battery module are structurally identical.

6. The modular energy storage system of claim 1 in which:
the base face is indented to form a receptacle encircled and defined by a peripheral rim of the base, with the receptacle defining the bottom seat; and
the top face has a raised part encircled and defined by a peripheral ledge, with the raised part defining the top seat, and the raised part being shaped to fit within the receptacle of an adjacent battery module.

7. The modular energy storage system of claim 6 in which:
the associated electrical connector of the top seat is located within a female receptacle in the raised part; and
the associated electrical connector of the bottom seat forms a male part that depends from the receptacle of the base face.

8. The modular energy storage system of claim 7 in which a base end of the male part sits above a plane defined by the bottom face.

9. The modular energy storage system of claim 1 in which the bottom seat and the top seat, and respective associated electrical connectors, are structured to permit the battery module to mount to a second battery module identical in structure to the battery module about a plurality of angular orientations relative to one another defined about a stacking axis of the modular energy storage system.

10. The modular energy storage system of claim 9 in which the bottom seat and the top seat, and respective associated electrical connectors, are structured such that the plurality of angular orientations include a pair of positions that are 180 degrees apart relative to one another about the stack axis.

11. The modular energy storage system of claim 1 further comprising locking parts to one or more of:
secure the battery module to the control module; and
secure the battery module to a second battery module that is identical in structure to the battery module and is stacked below the battery module.

12. The modular energy storage system of claim 1 in which the internal charge-and-discharge electrical components comprise an inverter.

13. The modular energy storage system of claim 12 in which the control module comprises a heat sink connected to the inverter.

14. The modular energy storage system of claim 13 in which the heat sink:
is formed by one or both finned or corrugated metal; and wraps circumferentially around, to define an external surface of, the control module.

15. The modular energy storage system of claim 13 in which:
the inverter is a fanless inverter;
the heat sink has an internal part that forms an internal structural frame of the inverter;
the heat sink has an external part that forms an external surface of the control module; and
the internal part and the external part are formed of thermally conductive materials in thermal communication with one another.

16. The modular energy storage system of claim 15 in which the internal part mounts metal oxide field effect transistors (MOSFET) of the inverter.

17. The modular energy storage system of claim 1 in which the control module further comprises a removable flashlight, which has an internal battery and is reversibly mounted to the control module with the internal battery connected to the internal charge-and-discharge electrical components.

18. The modular energy storage system of claim 1 in which the control module has a bottom seat and associated electrical connector that mate with the top seat and associated electrical connector, respectively, of the battery module.

19. A modular energy storage system comprising:
a battery module with a battery and internal circuitry;
a control module with a power outlet, internal charge-and-discharge electrical components, and a power inlet for connection to a power source in use;
the battery module defining a top seat that has an associated electrical connector;
the battery module being mounted to the control module below the control module by the top seat, whose respective associated electrical connector connects to the internal charge-and-discharge electrical components to permit the control module to:
charge the battery module with power from the power source; and
discharge the battery module by transferring power from the battery module to the power outlet;
the battery module defining a bottom seat with an associated electrical connector;
the bottom seat of the battery module being structured such that if a second battery module that is structurally identical to the battery module were stacked below the battery module, the bottom seat and associated electrical connector of the battery module would mate with a top seat and an associated electrical connector, respectively, of the second battery module, to permit the control module to charge and discharge the battery module and the second battery module;
the battery module having a housing formed by a sidewall, a base defining a base face, and a roof defining a top face;
the bottom seat being defined by the base face;
the top seat being defined by the top face;
the base face being indented to form a receptacle encircled and defined by a peripheral rim of the base, with the receptacle defining the bottom seat; and
the top face having a raised part encircled and defined by a peripheral ledge, with the raised part defining the top seat, and the raised part being shaped to fit within the receptacle of an adjacent battery module.

20. A modular energy storage system comprising:
a battery module with a battery and internal circuitry;
a control module with a power outlet, internal charge-and-discharge electrical components, and a power inlet for connection to a power source in use;
the battery module defining a top seat that has an associated electrical connector;
the battery module being mounted to the control module below the control module by the top seat, whose respective associated electrical connector connects to the internal charge-and-discharge electrical components to permit the control module to:
charge the battery module with power from the power source; and
discharge the battery module by transferring power from the battery module to the power outlet;
the battery module defining a bottom seat with an associated electrical connector;
the bottom seat of the battery module being structured such that if a second battery module that is structurally identical to the battery module were stacked below the battery module, the bottom seat and associated electrical connector of the battery module would mate with a top seat and an associated electrical connector, respectively, of the second battery module, to permit the control module to charge and discharge the battery module and the second battery module; and
the bottom seat and the top seat, and respective associated electrical connectors, being structured to permit the battery module to mount to a second battery module that is structurally identical to the battery module about a plurality of angular orientations relative to one another defined about a stacking axis of the modular energy storage system.

* * * * *